(12) United States Patent
Matsui et al.

(10) Patent No.: US 9,202,665 B2
(45) Date of Patent: Dec. 1, 2015

(54) CHARGED PARTICLE BEAM APPARATUS FOR REMOVING CHARGES DEVELOPED ON A REGION OF A SAMPLE

(75) Inventors: Hiroyuki Matsui, Hitachinaka (JP);
Osamu Komuro, Hitachinaka (JP);
Makoto Nishihara, Hitachinaka (JP);
Zhaohui Cheng, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/981,952

(22) PCT Filed: Nov. 30, 2011

(86) PCT No.: PCT/JP2011/006672
§ 371 (c)(1),
(2), (4) Date: Oct. 14, 2013

(87) PCT Pub. No.: WO2012/101704
PCT Pub. Date: Aug. 2, 2012

(65) Prior Publication Data
US 2014/0027635 A1   Jan. 30, 2014

(30) Foreign Application Priority Data

Jan. 26, 2011 (JP) .................. 2011-013560

(51) Int. Cl.
*H01J 37/28* (2006.01)
*H01J 37/02* (2006.01)

(52) U.S. Cl.
CPC .............. *H01J 37/026* (2013.01); *H01J 37/28* (2013.01); *H01J 2237/0044* (2013.01); *H01J 2237/047* (2013.01)

(58) Field of Classification Search
CPC ......... H01J 37/00; H01J 37/02; H01J 37/026; H01J 37/07; H01J 37/20; H01J 37/26
USPC ............................... 250/306, 307, 311, 396 R
See application file for complete search history.

(56) References Cited

U.S. PATENT DOCUMENTS 7,015,468 B1 * 3/2006 Azordegan et al. ........... 250/307
7,683,319 B2   3/2010 Makino et al.
(Continued)

FOREIGN PATENT DOCUMENTS

JP   10-012684 A     1/1998
JP   2003-303568 A   10/2003
(Continued)

*Primary Examiner* — Jack Berman
*Assistant Examiner* — Jason McCormack
(74) *Attorney, Agent, or Firm* — Miles & Stockbridge P.C.

(57) ABSTRACT

Provided is a charged particle beam apparatus adapted so that even when an additional device is not mounted in the charged particle beam apparatus, the apparatus rapidly removes, by neutralizing, a local charge developed on a region of a sample that has been irradiated with a charged particle beam.

After charged particle beam irradiation for measurement of the sample, the apparatus controls a retarding voltage or/and an accelerating voltage at a stage previous to a next measurement, and then neutralizes an electric charge by reducing a difference between a value of the retarding voltage and that of the accelerating voltage to a value smaller than during the currently ongoing measurement.

The charged particle beam achieves neutralizing without reducing throughput, since the local charge developed on the region of the sample that has been irradiated with the charged particle beam is removed, even without an additional device mounted in the apparatus.

17 Claims, 17 Drawing Sheets

(56) References Cited

U.S. PATENT DOCUMENTS

| | | |
|---|---|---|
| 8,153,966 B2 | 4/2012 | Arai et al. |
| 2003/0193024 A1* | 10/2003 | Takagi .................... 250/310 |
| 2006/0054815 A1* | 3/2006 | Bertsche et al. ............. 250/310 |
| 2007/0210250 A1* | 9/2007 | Ward et al. .................. 250/307 |
| 2009/0039281 A1* | 2/2009 | Kawasaki et al. ......... 250/396 R |
| 2009/0166557 A1* | 7/2009 | Makino et al. ........... 250/442.11 |
| 2009/0206257 A1 | 8/2009 | Gunji et al. |
| 2010/0012838 A1* | 1/2010 | Hatakeyama et al. ........ 250/307 |
| 2010/0032566 A1* | 2/2010 | Naito et al. .................. 250/307 |
| 2011/0204263 A1* | 8/2011 | Phaneuf et al. ............ 250/492.2 |

FOREIGN PATENT DOCUMENTS

| | | |
|---|---|---|
| JP | 2006-114426 A | 4/2006 |
| JP | 2006-234789 A | 9/2006 |
| JP | 2009-192345 A | 8/2009 |
| JP | 2009-277587 A | 11/2009 |
| JP | 2010-211973 A | 9/2010 |
| WO | WO 2007051313 A1 * | 5/2007 |

* cited by examiner

FIG.3-A
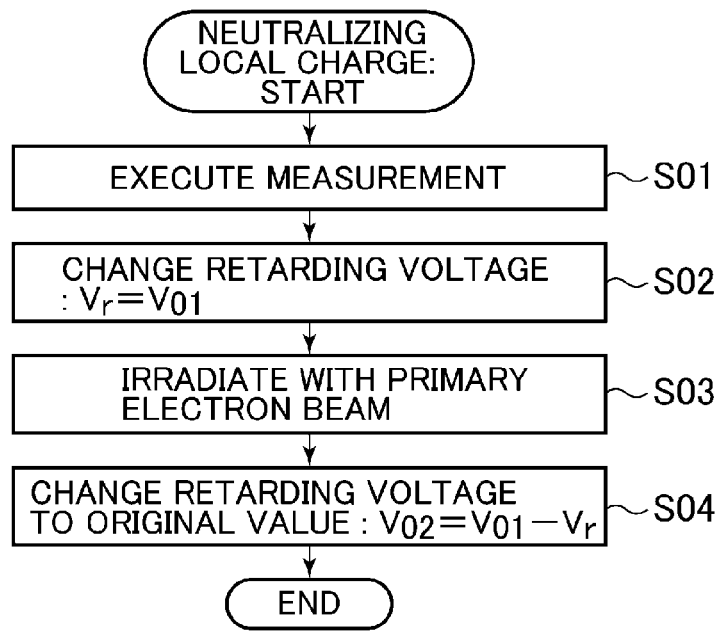
FIG.3-B
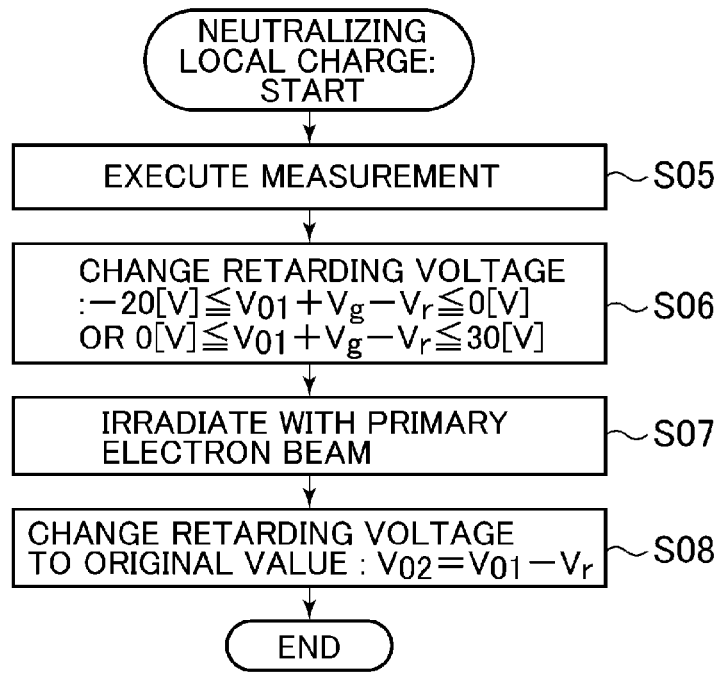

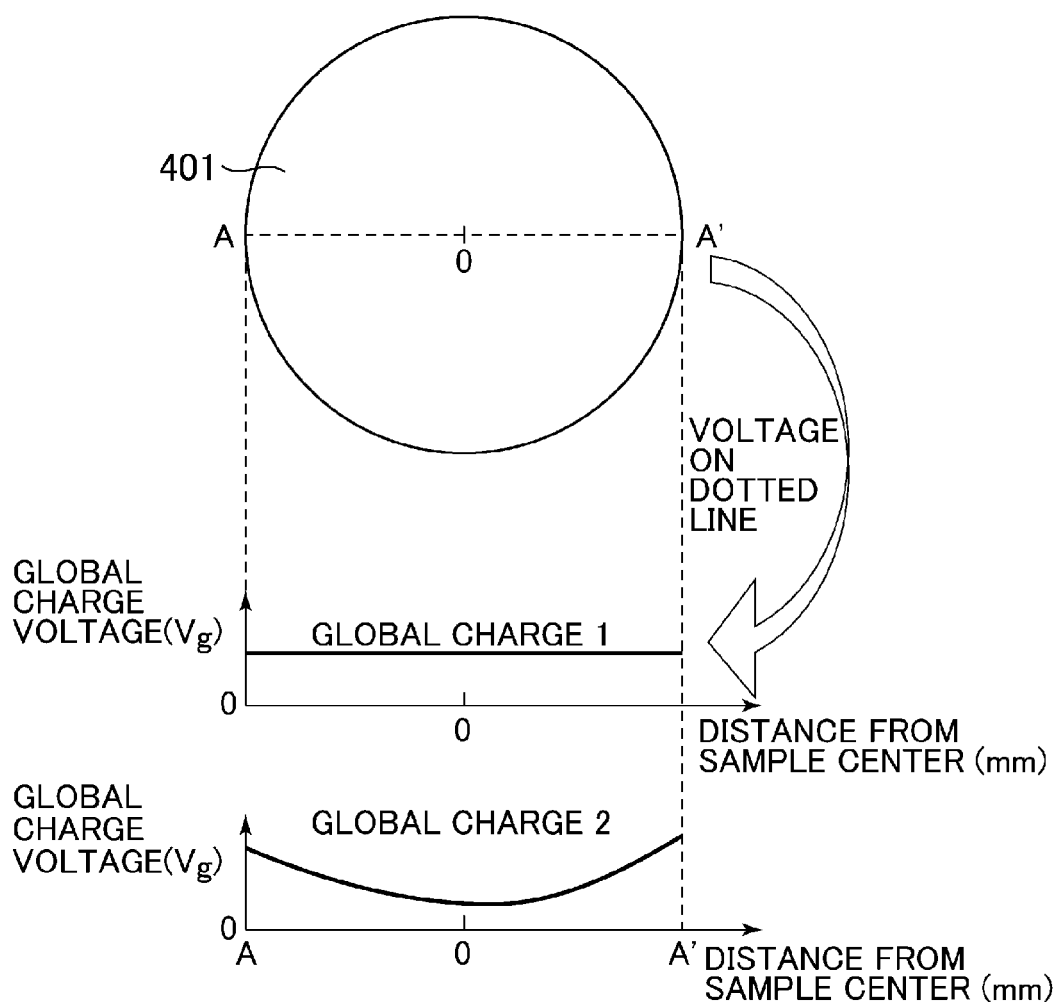

FIG.6-A

FIG.6-B
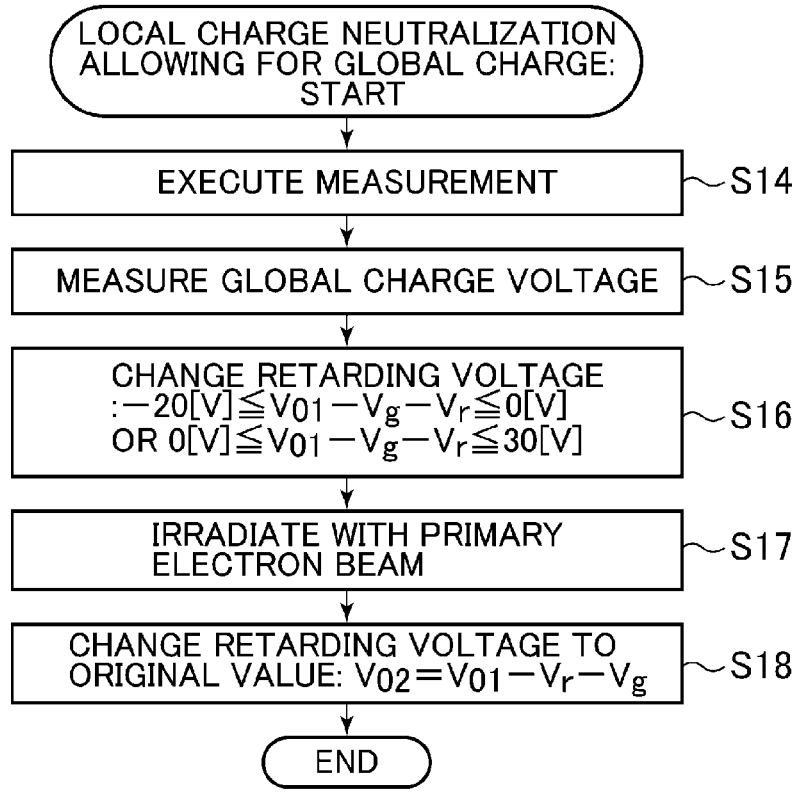
FIG.7
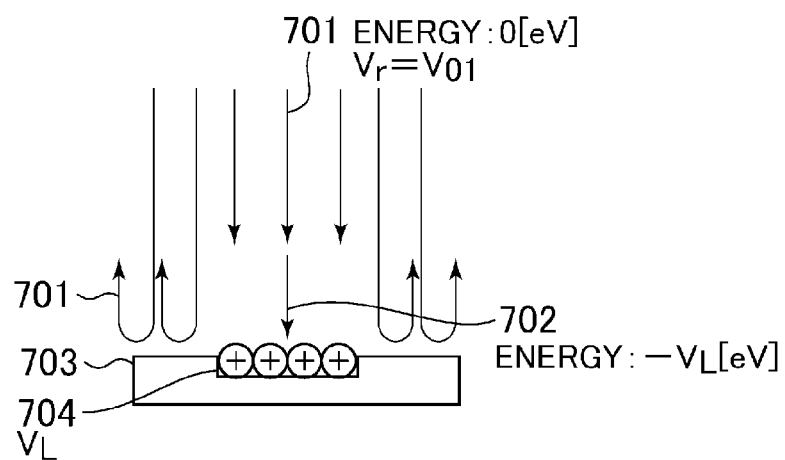

FIG.8
(1) $V_r = V_{01} - V_{L1}$
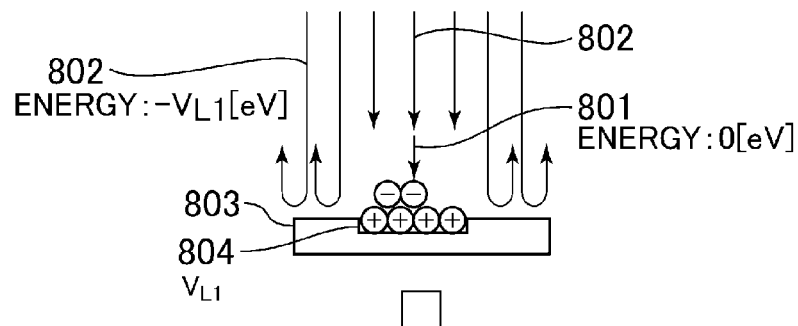
(2) $V_r = V_{01} - V_{L1}$
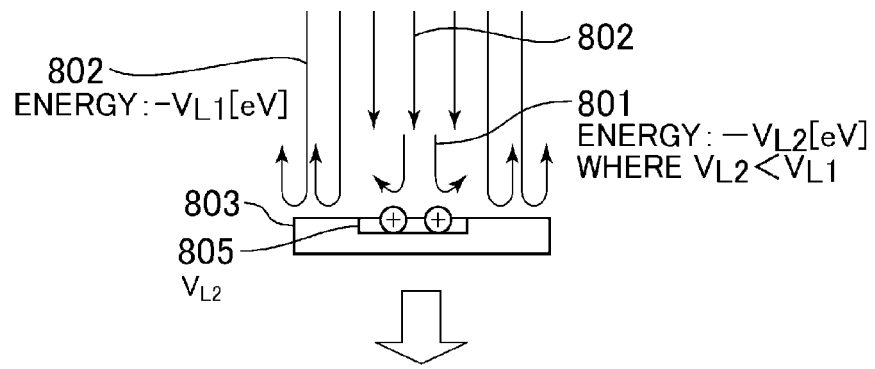
(3) $V_r = V_0 - V_{L2}$, WHERE $V_{L2} < V_L$
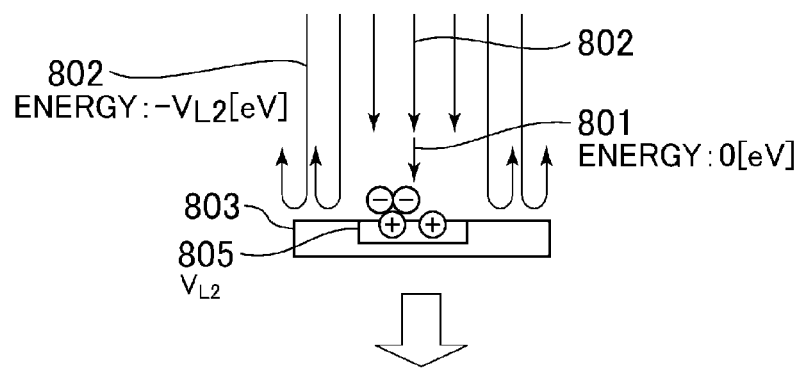
(4) $V_r = V_{01}$
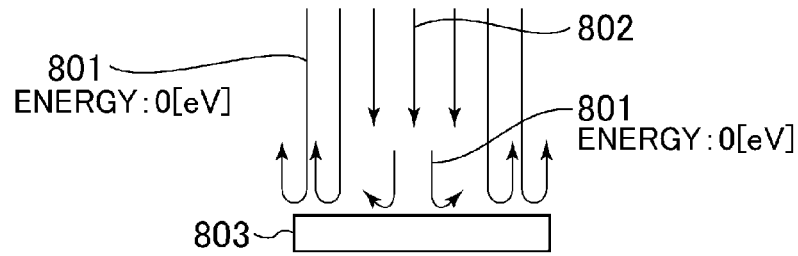

CHARGED PARTICLE BEAM APPARATUS FOR REMOVING CHARGES DEVELOPED ON A REGION OF A SAMPLE

TECHNICAL FIELD

The present invention relates generally to charged particle beam apparatuses, and more particularly, to a method and apparatus for neutralizing a charge present on a surface of a sample.

BACKGROUND ART

Scanning electron microscopes (SEM) and focused ion beam (FIB) systems are available as the apparatuses that observe, measure, and/or process a sample using a beam of charged particles, such as an electron beam or an ion beam. These apparatuses irradiate the surface of a sample with a beam of charged particles, detect the secondary charged particles arising from the sample, and thus acquire a two-dimensional image signal representing the surface topography of the sample.

Irradiation with the beam of charged particles may generate a temporary positive or negative charge in the irradiated region of the sample due to a difference between the number of charged particles incident upon the sample and that of secondary charged particles released from the sample. The charge that the charged particle beam thus generates in the irradiated region is called a local charge, and this region covers a range of several hundreds of micrometers ($\mu$m) square.

Scanning the charged particle beam a plurality of times in this extremely small region increases an impact of the local charge upon the sample surface, thus causing astigmatism, changes in magnification, and other events.

A method of mounting an electron shower generating device and an ion shower generating device, as disclosed in Patent Document 1 listed below, exists as a way to resolve the problem of astigmatism and changes in magnification, caused by the local charge on the sample surface. In addition, Patent Document 2 listed below discloses, as a method of neutralizing both the above local charge and a global charge that occurs extensively on the sample, employing an electrode unit in which a charged particle beam source for local charge neutralizing, and a charged particle beam source for global charge neutralizing are equipped additionally.

PRIOR ART LITERATURE

Patent Documents

Patent Document 1: JP-199-12684-A
Patent Document 2: JP-2009-277587-A

SUMMARY OF THE INVENTION

Problems to be Solved by the Invention

However, it becomes necessary to mount additionally, in the method of Patent Document 1, the devices that generate an electron shower and an ion shower, and in the method of Patent Document 2, the charged particle beam source for local charge neutralizing and the charged particle beam source for global charge neutralizing.

Mounting these additional devices is likely to lead to difficulty with operations in a small space as in a sample chamber, and to reduce image resolution due to possible extension of a working distance (WD), a clearance between the sample and a lower surface of an objective lens. In addition, throughput is estimated to decrease, since there is a need to move a sample stage to locations of each devices.

Furthermore, since the charged particle beam is bent by the charge deposited on the sample surface, critical-dimension SEM that requires prior registration of measuring positions for automatic measurement is known to cause a field-of-view deviation at a next measuring point due to the bending of the primary electron beam. Because of these factors, a stable electron image will not be obtained during an extended time of sample observation.

An object of the present invention is to provide means that rapidly removes, by neutralizing, an electric charge from a region irradiated with a charged particle beam, the neutralization being achieved even when an additional device is absent in a charged particle beam apparatus.

Means for Solving the Problems

Provided as an aspect of the present invention for achieving the above object is a charged particle beam apparatus configured so that after charged particle beam irradiation for measurement of a sample, the apparatus controls a retarding voltage or/and an accelerating voltage at a stage previous to a next measurement, and then neutralizes an electric charge by reducing a difference between a value of the retarding voltage and that of the accelerating voltage to a value smaller than during the currently ongoing measurement.

Effects of the Invention

In accordance with the above aspect, since the charged particle beam apparatus can implement the neutralization even when an additional device is not mounted in the charged particle beam apparatus, a local charge on a surface of the sample can be neutralized without reducing operational convenience in a sample chamber and throughput.

Other objects of the present invention and a further detailed configuration of the charged particle beam apparatus will be described in the DESCRIPTION OF PREFERRED EMBODIMENTS.

BRIEF DESCRIPTION OF THE DRAWINGS

FIG. 3-A is a flowchart showing the step of neutralizing a local charge in the absence of a global charge on the sample surface (under a condition of $V_r\text{-}V_{01}$);

FIG. 3-B is a flowchart showing the step of neutralizing a local charge in the absence of a global charge on the sample surface (under a condition of $-20[V] \leq V_{01}-V_r \leq 0[V]$ or $0[V] \leq V_{01}-V_r \leq 30[V]$);

FIG. 4 is a diagram representing a relationship between a global charge voltage on the sample and a position of the sample;

FIG. 6-B is a flowchart showing the step of neutralizing a local charge in the presence of a global charge on the sample surface (under a condition of $-20[V] \leq V_{01} - V_g - V_r \leq 0[V]$ or $0[V] \leq V_{01} - V_g - V_r \leq 30[V]$);

FIG. 7 shows primary electron beam irradiation under a $V_r = V_{01}$ condition for a local charge in the absence of a global charge on the sample surface;

FIG. 8 is a schematic diagram that shows a charge-neutralizing method allowing for suppressed progress of a local charge in the absence of a global charge on the sample surface;

MODE FOR CARRYING OUT THE INVENTION

The following describes embodiments for implementing a charged particle beam apparatus and computer programs. A charged particle beam apparatus, at a stage after the current measurement with irradiation for the sample and before the next measurement, controls a retarding voltage or/and an accelerating voltage to keep the retarding voltage higher than the accelerating voltage, so that the voltages are supplied to a region of the sample that will be electrically charged, with electrons being away from the sample. The computer programs cause a computer to execute above processing.

In the above embodiments, a local charge on the sample surface can be removed by neutralizing, without a decrease in throughput.

The method and apparatus for neutralizing the local charge on the sample surface, and the computer programs that cause the computer to execute above processing are described below referring to the accompanying drawings. While a SEM, one form of charged particle beam apparatus, is described as an example below, the present invention can also be applied to other apparatuses, for example an FIB apparatus and the like, without being limited to the SEM. In addition, for specific kinds of products to which the present invention is applied, and under specific experimental conditions, the invention can be applied to both a case in which the sample is positively charged, and a case in which the sample is negatively charged.

Figure 1:
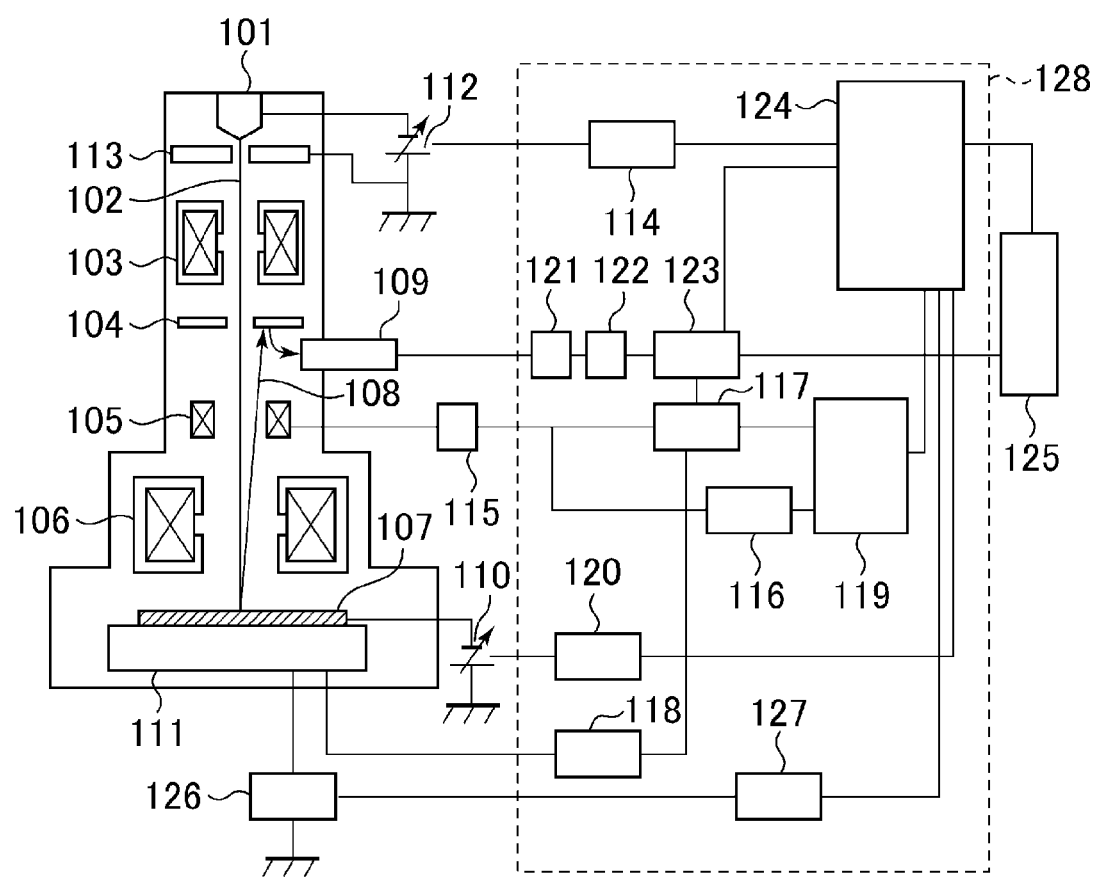
FIG. 1 is a schematic block diagram of a scanning electron microscope (SEM)

FIG. 1 shows a schematic of the SEM. In the SEM, electrons that have stemmed from an electron source 101 are first accelerated by primary electron accelerating electrodes 113 to which a voltage has been applied from an accelerating power supply 112. Next, the electrons are decelerated by a retarding voltage that has been applied from a retarding power supply 110 to a surface of the sample 107, and then focused by objective lenses 106. In this way, the sample 107 on a sample stage 111 is irradiated.

The retarding voltage is briefly described below. In SEMs and FIB apparatuses, voltage is applied to a sample to control attainable energy intensity of an electron beam so that the charged particle beam is focused upon a surface of the sample without damaging circuit elements formed on circuit patterns of the sample. This applied voltage is called the retarding voltage. A decelerating electric field that the retarding voltage has formed acts as a field to decelerate the electrons incident on the sample. For secondary electrons released from the sample, the decelerating electric field acts as an electric field to accelerate the secondary electrons towards the electron beam source.

The irradiation of the primary electron beam 102 to the sample 107 causes the secondary electrons 108 to arise from the sample 107 and then the secondary electrons 108 to be accelerated towards the electron source by the electric field formed by the retarding voltage. The secondary electrons 108 collide to a reflective plate 104, and these reflected secondary electrons 108 are captured by a secondary electron detector 109. An output from the secondary electron detector 109 changes according to the number of electrons incident upon the detector.

A control device 128 electrically controls various controllers described below.

The primary electron beam 102 is scanned over the sample by a deflecting (scanning) coil unit 105, and the output of the secondary electron detector 109 is amplified as an electric signal by an amplifier 121 in synchronization with the scan. The amplified electric signal is computed by an arithmetic unit 122, converted into image contrast and other luminance information, and stored as a scan image into an image memory 123. The stored image, after being acquired as a two-dimensional image of a surface topography of the sample or after undergoing computation by an arithmetic device 124 described later, is displayed on a display device 125.

A position controller 119 controls electron beam scanning positions and magnifications by controlling an image shifter 116 and a scan controller 117. The image shifter 116 controls the deflecting (scanning) coils 105, and the scan controller 117 controls the deflecting (scanning) coils 105 and the sample stage 111.

The arithmetic device 124 uses image-processing hardware such as a CPU to conduct image processing appropriate for a particular purpose. The arithmetic device 124 also has a function that creates a line profile based upon the image luminance information stored within the image memory 123 and measures dimensions between peaks of the profile. Results that have been obtained in these steps are displayed on the display device 125, such as an external display, that is connected to the arithmetic device 124. The display device 125 has, for example, a GUI function that displays images, inspection results, to an operator. In addition, the arithmetic device 124 controls a high-voltage controller 114, a position controller 119, a retarding voltage controller 120, and an ammeter controller 127

The control device 128 can also be connected to a device that creates, for example, coordinates of an electronic device required for dimension measurement, inspection, and other purposes, a pattern-matching template to be used for positioning, and a scanning recipe that includes scanning parameters. This connection may be conducted via a network, a path, or the like. Additionally, the control device 128 naturally includes a controller not shown. Furthermore, each controller included in the control device 128 may be either hardware-mounted or software-mounted, or a plurality of controllers may be mounted collectively according to particular device conditions.

As discussed earlier herein, the critical-dimension SEM is widely used as an apparatus for measuring a geometry, line and other dimensions of semiconductor circuit patterns. FIG. 1 shows a basic configuration of the critical-dimension SEM. The semiconductor circuit patterns here refer to patterns as many as from hundreds to thousands of pieces created in a very small region of several hundred micrometers (μm) square on the sample called a semiconductor wafer, and it is assumed that these patterns will all be measured with the critical-dimension SEM.

Automatic measurement by the critical-dimension SEM is possible by writing a series of measuring steps in a file of a scanning recipe. As very neighboring patterns are continuously measured, however, an impact of the local charge which has been generated upon the sample surface by the irradiation with the primary electron beam 102 will gradually be more significant. Accordingly, the primary electron beam 102 will be bent by mutual repelling force between the charge on the sample 107 and the charge of the beam 102 during execution of the recipe, so pattern detection will fail and the automatic measurement will be impossible. Even if the automatic measurement itself takes place, the charge on the sample will cause astigmatism and/or changes in magnification, thus rendering an accurate dimension difficult to measure.

Predosing is one of precharging methods for performing an electron beam scan that positively charges a sample surface prior to acquisition of images for measurement and/or inspection of the sample. More specifically, the surface of the sample is positively charged by scanning a beam over the sample surface, with the beam used having a secondary electron generating efficiency δ (a value obtained by dividing the number of electrons stemming from the sample, by that of electrons delivered to the sample) being larger than 1. After such predosing, when the beam for the formation of an image is scanned, electrons generated in a hole bottom, a lower section of a pattern, will be attracted to the positive charge on the sample surface, so that the electrons generated in the hole bottom will be captured with high efficiency.

Additionally, a precharging method is available for defect inspection of the sample. In the precharging method, prior to the acquisition of images for inspection, a sample is scanned particularly with a beam that forms, contrary to the positive charge, a negative charge (e.g., a beam whose secondary electron generating efficiency δ is less than 1). This method is effective in recent cases as follows: under a tendency towards finer patterning and/or denser integration in the semiconductor-manufacturing processes, unique charge down to a deep bottom section of a contact hole cannot be implemented by the normal electron beam scanning, with the result that sufficient electric-potential contrast for detecting a defect as a secondary electron image cannot be provided.

When the predosing or precharging method described above is used, upon completion of pattern measurement and/or inspection, neutralizing needs to be executed to eliminate impacts of associated electric charges The following embodiments are proposed with the above in mind.

First Embodiment

The way the charge caused by the irradiation of the sample with the beam of charged particles is neutralized is described below using FIG. 2. This description assumes that the charge on the sample surface is a positive charges. In addition, the description relates to a case in which a global charge formed in a wide region of the sample is absent.

Irradiation of a primary electron beam 202 to the Sample causes secondary electrons 205 to arise from the sample. This state is shown in (1) of FIG. 2. The SEM uses the secondary electrons 205 to display the topography of the sample surface as a two-dimensional image. At this time, the sample surface on the region irradiated with the primary electron beam becomes positively charged if the secondary electron generating efficiency δ is 1 or more, that is, if the number of secondary electrons which have arisen from the sample is larger than that of primary electrons delivered to the sample. This state of the sample surface is shown in (2) of FIG. 2.

Figure 2:
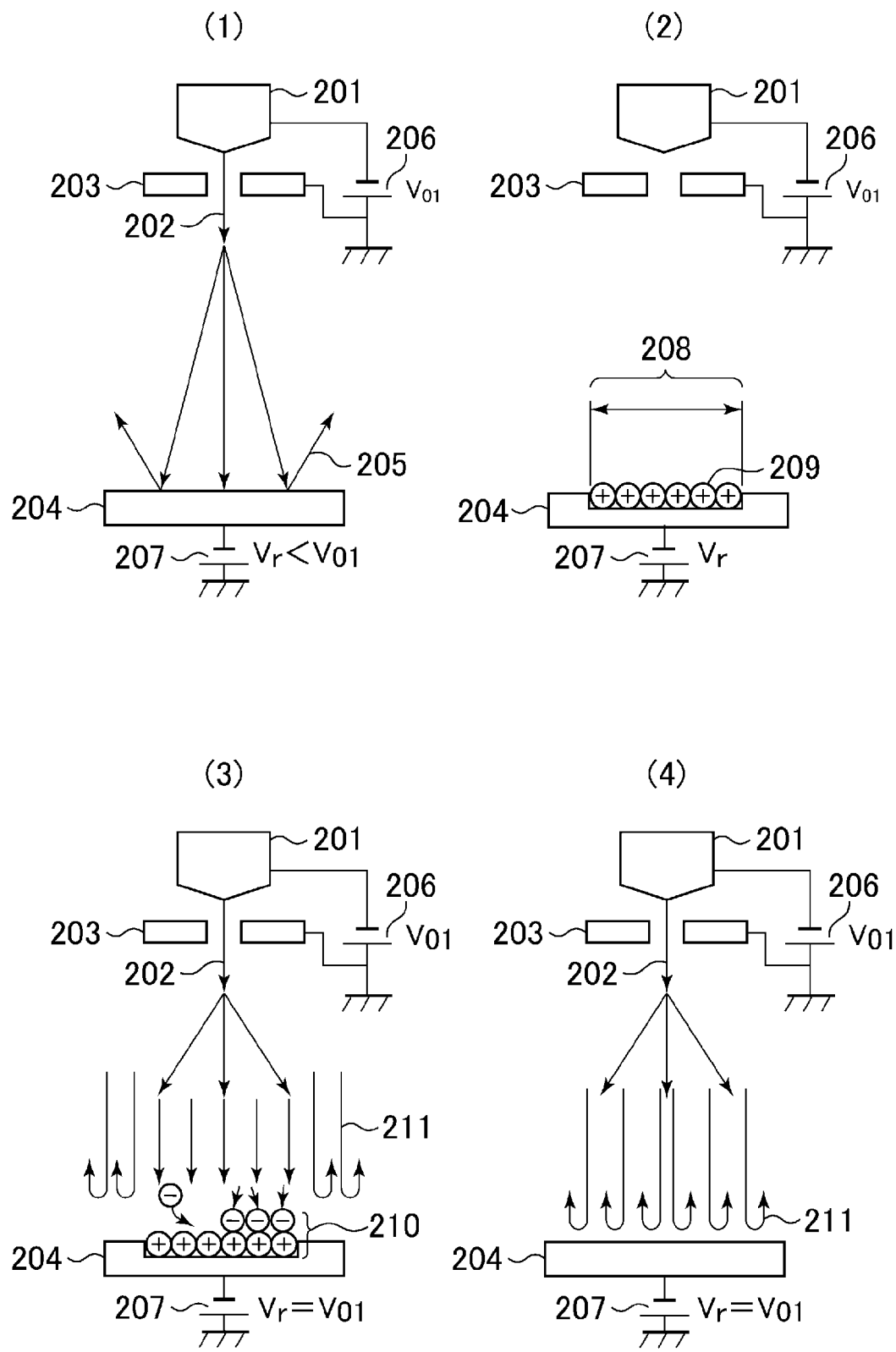
FIG. 2 is a schematic diagram showing a method of neutralizing a local charge in absence of a global charge on a sample surface.

Referring to FIG. 2, let the accelerating voltage applied from the accelerating power supply 206 for the primary electron beam 202 be $V_{01}$ and the retarding voltage applied from the retarding power supply 207 be $V_r$. Since electrons have a negative charge, the accelerating voltage $V_{01}$ for accelerating the primary electron beam towards the sample is a negative voltage and the retarding voltage $V_r$ for reducing the energy of the charged particle beam that reaches the sample is also a negative voltage. Suppose that both $V_{01}$ and $V_r$ take an absolute value in FIG. 2. $V_r > V_{01}$, this indicates that a negative electric field that the retarding voltage $V_r$ has formed before the primary electron beam reaches the sample surface causes the primary electron beam to reflect towards the sample surface and fail to reach the sample surface. If $V_r < V_{01}$, this indicates that the primary electron beam reaches the sample surface. If $V_r = V_{01}$, this indicates that the energy of the primary electron beam on the sample surface is 0 [eV]. Referring to (3) of FIG. 2, the retarding voltage $V_r$ is controlled to increase in a negative direction so that $V_r = V_{01}$, and the primary electron beam is delivered at the same position as where the primary electron beam is delivered to the sample in (1) of FIG. 2. Since in this state the accelerating voltage $V_{01}$ and the retarding voltage $V_r$, that is the decelerating voltage, are of the same value, both counteract each other, resulting in the energy of the primary electron beam becoming 0 [eV] on the sample surface. At this time, the positive charge in the region of the sample that has been positively charged with the local charge, and the negative charge of each electron of the primary electron beam in vicinity of the sample surface attract each other, whereby the local charge is then removed from the sample by neutralizing (209).

After the local charge has been removed, the energy of the primary electron beam on the sample surface remains in a neighborhood of 0 [eV], which prevents the primary electron beam 202 from substantially reaching the sample 204 and thus from impacting the sample. This state is shown in (4) of FIG. 2.

FIG. 3-A shows a flowchart of a method for neutralizing a local charge. First after the measurement for image acquisition (step S01), the retarding voltage $V_r$ is changed to satisfy $V_r = V_{01}$ and generate a primary electron beam energy of 0 [eV] on the sample surface (step S02). In accordance with the condition that was set in step S02, a primary electron beam is emitted from the electron source, towards the sample, at the same position as that of the sample measurement (step S03). In this state, as described in (3) of FIG. 2, the positive charge in the charged region on the sample and the negative charge of each electron of the primary electron beam in the vicinity of the sample surface attract each other, whereby the local charge is then removed from the sample by neutralizing. After the neutralization, the retarding voltage $V_r$ is returned to its original value corresponding to normal conditions that have been established before the above change (step S04). If the accelerating voltage acting upon the primary electron beam on the sample surface at this time is taken as $V_{02}$, this voltage is expressed as $V_{02}=V_{01}-V_r$. A way to determine whether the neutralization has been completed will be described in a fifth embodiment.

In addition, data for programming this flowchart can be incorporated into the scanning electron microscope or any other appropriate charged particle beam apparatus. Furthermore, an ion beam, not the primary electron beam, can likewise be used. In this case, if the ion source generates negative ions, a positive charge can be neutralized; if the ion source generates positive ions, a negative charge can be neutralized.

Moreover, although the retarding voltage $V_r$ is changed in the above flowchart, the energy of the primary electron beam on the sample surface may be controlled to 0 [eV] by changing the accelerating voltage $V_{01}$ to be applied to the primary electron accelerating source, or by changing both the retarding voltage $V_r$ and the accelerating voltage $V_{01}$. Changing the retarding voltage $V_r$ has the following advantage over changing the accelerating voltage $V_{01}$: changing the accelerating voltage $V_{01}$ also requires controlling other optical parameters of the SEM that change with the voltage change, but changing the retarding voltage $V_r$ requires no such control.

Second Embodiment

While in the first embodiment the retarding voltage $V_r$ has been controlled so that $V_r=V_{01}$, the neutralizing of the charge on the sample can likewise be accomplished by using conditions under which the difference between a value of the accelerating voltage $V_{01}$ and that of the retarding voltage $V_r$ becomes smaller than under the sample-measuring conditions. In such a case, the value of the retarding voltage $V_r$ is increased in the negative direction, or/and the value of the accelerating voltage $V_{01}$ is increased in a positive direction, from the conditions that the absolute value of the accelerating voltage $V_{01}$ during the measurement of the sample is greater than the absolute value of the retarding voltage $V_r$. Thus the respective absolute values of the accelerating voltage $V_{01}$ and the retarding voltage $V_r$ are changed before neutralizing, to reduce the difference between the values of both. To be more specific, the energy of the primary electron beam delivered to the sample in that case is set to range between −20 [eV] and 0 [eV] or between 0 [eV] and +30 [eV]. In the −20 to 0 [eV] energy range, $V_r>V_{01}$ holds and the primary electron beam does not reach the sample, for which reason the negative charge of each primary electron is neutralized with the positive charge in the charged region of the sample and thus the local charge is removed. In the 0 to +30 [eV] energy range, on the other hand, $V_{01}>V_r$ holds and the number of electrons released from the sample decreases below that of electrons incident upon the sample, that is, the secondary electron generating efficiency of the primary electron beam with respect to the sample decreases to 1 or less. Under these conditions, the negative charge of each primary electron is neutralized with the positive charge in the charged region of the sample and thus the local charge is removed.

FIG. 3-B shows a flowchart of another method for neutralizing a local charge. First after the measurement for image acquisition (step S05), the retarding voltage $V_r$ is increased in the negative direction so that the difference between $V_r$ and $V_{01}$ decreases from the conditions of the retarding voltage $V_r$ and accelerating voltage $V_{01}$ applied during the measurement. To be more specific, the retarding voltage $V_r$ is changed so that the energy of the primary electron beam on the sample surface ranges between −20 [eV] and 0 [eV] or between 0 [eV] and +30 [eV] (step S06). In accordance with the condition that was set in step S02, a primary electron beam is emitted from the electron source towards the sample (step S07). In this state, as described in (3) of FIG. 2, the positive charge in the charged region on the sample and the negative charge of each electron of the primary electron beam in the vicinity of the sample surface attract each other, whereby the local charge is then removed from the sample by neutralizing. After the neutralization, the retarding voltage $V_r$ is returned to its original value corresponding to the normal conditions that were established before the above change (step S08). If the accelerating voltage acting upon the primary electron beam on the sample surface at this time is taken as $V_{02}$, this voltage is expressed as $V_{02}=V_{01}-V_r$. The way to determine whether the neutralization has been completed will be described in the fifth embodiment.

Although the retarding voltage $V_r$ is changed in the above flowchart, the energy of the primary electron beam on the sample surface may instead be controlled to −20 to 0 [eV] or 0 to +30 [eV], by changing the accelerating voltage $V_{01}$ to be applied to the primary electron accelerating source, or by changing both the retarding voltage $V_r$ and the accelerating voltage $V_{01}$.

Third Embodiment

Examples in which a global charge is absent in the sample have been described in the first and second embodiments. A method of neutralizing in presence of a global charge in the sample is described here. The global charge, unlike the local charge, is a charge inherent in the sample or formed therein as a result of charging in the step preceding the measurement or inspection, or as a result of the secondary electron beam being returned to the sample surface by the electric field that the opposed electrodes on the sample have formed, and then sticking to the sample again. The global charge spans a relatively wide region nearly of several tens of millimeters. If the sample is charged, since a focal position differs according to the charge voltage, the focal position needs to be changed. In addition to a global charge with a uniform voltage on the sample, as with a global charge 1 shown in FIG. 4, there exists a global charge whose voltage differs according to position on the sample or distance from a central position of the sample, as with a global charge 2 shown in FIG. 4. For this reason, prior to the measurement of the sample in the critical-dimension SEM, a global charge voltage is measured at several points on the sample in advance and then the focal position is controlled to match the charge voltage corresponding to the position on the sample. To perform measurements in accordance with this sequence, it is necessary that when the local charge is removed in the presence of a global charge, only the local charge should be removed and the global charge should be left on the sample surface. The reason for this is that if the global charge is also removed, defocusing will result since the focal position has been controlled to match the global charge. This requires control so that neutralizing is done only upon the charge left after subtraction of the global charge from a total amount of charge in the region of the sample that has been irradiated with the charged particle beam.

Figure 5:
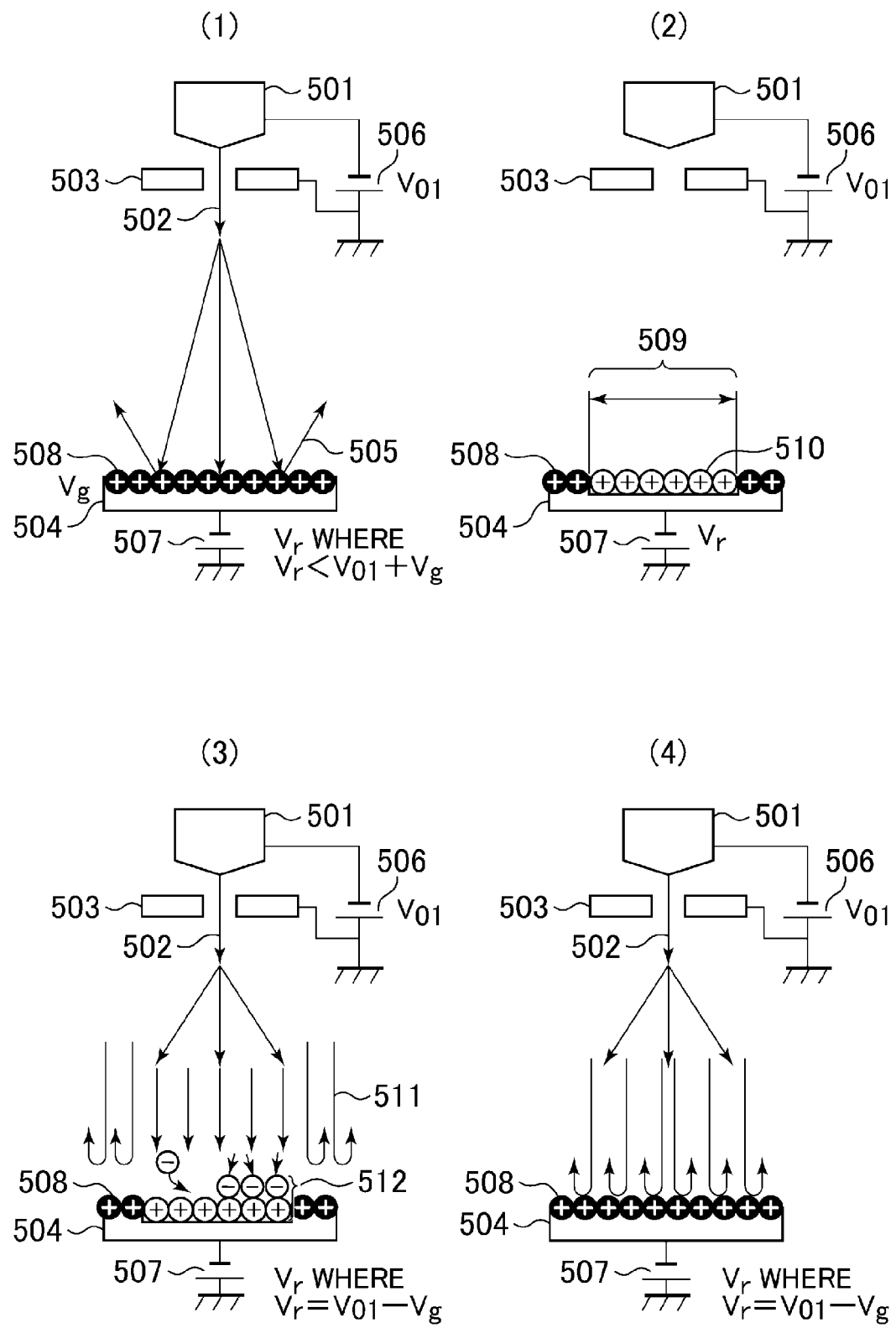
FIG. 5 is a schematic diagram showing a method of neutralizing a local charge in presence of a global charge on the sample surface.
Figure 6:
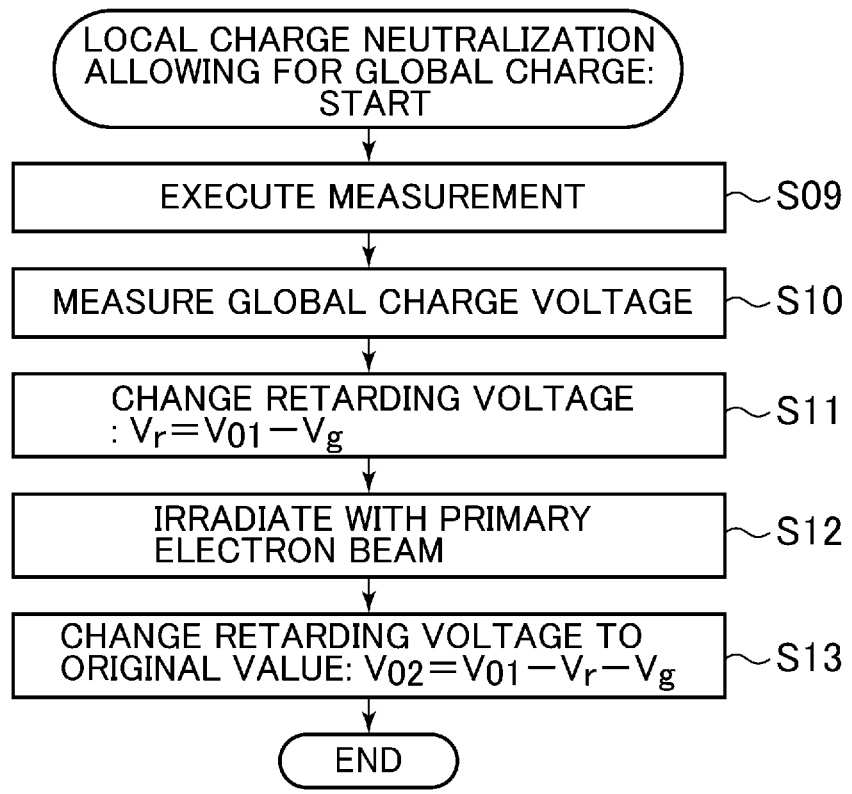
FIG. 6-A is a flowchart showing the step of neutralizing a local charge in the presence of a global charge on the sample surface (under a condition of $V_r=V_{01}-V_g$)

Based upon the above conditions, a method of neutralizing in the presence of the global charge is described below using FIGS. 5 and 6. FIG. 5 shows an example in which the sample has a global charge voltage of $V_g$ [V], and FIG. 6 shows a flowchart of the method of neutralizing in that example. When the sample is measured under a condition of $V_r<V_{01}+V_g$ as shown in (1) of FIG. 5, a local charge 510 occurs as in a primary electron irradiation range 509 shown in (2) of FIG. 5. Since the global charge exists, obtaining a primary electron beam energy of 0 [eV] on the sample requires changing $V_r$ allowing for the global charge. In other words, when the global charge exists, it is necessary to set $V_r=V_{01}-V_g$. For example, if the global charge is a positive charge of 0.1 [kV]

and the extracting/accelerating voltage is 3.0 [kV], the retarding voltage becomes a negative voltage expressed as $V_r$=3.0 [kV]−0.1 [kV]=2.9 [kV]. When the local charge is removed by neutralizing under this condition shown in (3) of FIG. 5, the charge voltage in the region where the local charge has existed equals the global charge voltage, as shown in (4) of FIG. 5.

Accordingly, the neutralization uses the following sequence. As shown in FIG. 6-A, after the measurement for image acquisition (step S09), the global charge voltage is measured (step S10) and the retarding voltage $V_r$ is changed to satisfy $V_r=V_{01}-V_g$ and generate a primary electron beam energy of 0 [eV] on the sample surface (step S11). Next in accordance with the condition that was set in step S11, a primary electron beam is emitted from the electron source towards the sample (step S12). In this state, as described in (3) of FIG. 5, the positive charge in the locally charged region and the negative charge of each electron of the primary electron beam attract each other, whereby the local charge is then removed from the sample by neutralizing. After the neutralization, $V_r$ is returned to its original value (step S13). If this sequence is used, the sample surface potential existing after the neutralization in the locally charged region can be set to equal the global charge voltage.

Although the retarding voltage $V_r$ is changed in the above flowchart, the energy of the primary electron beam on the sample surface may instead be controlled to 0 [eV] by changing the accelerating voltage $V_{01}$ or by changing both the retarding voltage $V_r$ and the accelerating voltage $V_{01}$.

Fourth Embodiment

While the retarding voltage $V_r$ has been controlled to satisfy $V_r=V_{01}-V_g$ in the third embodiment, the neutralizing of the local charge on the sample surface can also be conducted under a condition that reduces the difference between $V_r$ and $V_{01}-V_g$. In this case, the value of the retarding voltage $V_r$ during the measurement of the sample is increased in the negative direction or/and the value of the accelerating voltage $V_{01}$ is increased in the positive direction, whereby the retarding voltage is reduced for a smaller difference between $V_r$ and $V_{01}-V_g$, for neutralizing. To be more specific, the energy of the primary electron beam on the sample surface is set to range between −20 [eV] and 0 [eV] or between 0 [eV] and +30 [eV]. In the −20 to 0 [eV] energy range, $V_r > V_{01} - V_g$ holds and the primary electron beam does not reach the sample, for which reason the negative charge of each primary electron is neutralized with the positive charge in the charged region of the sample and thus the local charge is removed. In the 0 to +30 [eV] energy range, on the other hand, $V_{01}-V_g > V_r$ holds and the number of electrons released from the sample decreases below that of electrons incident upon the sample, that is, the secondary electron generating efficiency of the primary electron beam with respect to the sample decreases to 1 or less. Under these conditions, the negative charge of each primary electron is neutralized with the positive charge in the charged region of the sample and thus the local charge is removed.

FIG. 6-B shows a flowchart of a method for neutralizing the local charge in the above case. First after the measurement for image acquisition (step S14), the global charge voltage is measured (step S15) and the retarding voltage $V_r$ is changed to obtain a primary electron beam energy of −20 to 0 [eV] or 0 to +30 [eV] on the sample surface (step S16). Next in accordance with the condition that was set in step S16, a primary electron beam is emitted from the electron source towards the sample (step S17). In this state, as described in (3) of FIG. 6, the positive charge in the locally charged region and the negative charge of each electron of the primary electron beam attract each other, whereby the local charge is then removed from the sample by neutralizing. After the neutralization, the retarding voltage $V_r$ is returned to its original value (step S18). If this sequence is used, the electric potential existing on the sample surface after the neutralization in the locally charged region can be set to equal the global charge voltage.

Although the retarding voltage $V_r$ is changed in the above flowchart, the energy of the primary electron beam on the sample surface may instead 0 be controlled to −20 to 0 [eV] or 0 to +30 [eV] by changing the accelerating voltage $V_{01}$ or by changing both the retarding voltage $V_r$ and the accelerating voltage $V_{01}$.

During the above neutralization, even when the irradiation of the locally charged region with the primary electron beam is attempted, the difference from the normal measuring condition renders the irradiation unsuccessful since the field of view is likely to have shifted or rotated. Hence, a primary electron beam satisfying the above condition is emitted in advance and the position to which another primary electron beam is to be next emitted is adjusted using the deflecting coils that change a scanning angle, or using an image shifter that bends the primary electron beam, to calculate values suitable for irradiating a target position with the primary electron beam. During the neutralization, these values are used to irradiate the locally charged region with the primary electron beam.

Only applications relating to the method of controlling the retarding voltage $V_r$ to obtain the primary electron beam energy of 0 [eV] on the sample surface during the neutralization will be described in the fifth embodiment onward. Using substantially the same method as any one of the methods described above enables equivalent neutralization, even when the primary electron beam energy obtained is in the −20 to 0 [eV] range or the 0 to +30 [eV] range.

Fifth Embodiment

In the first and third embodiments, the primary electron beam energy of 0 [eV] has been obtained by controlling the retarding voltage to implement the neutralization. It is more effective, however, to control the retarding voltage so that the energy of the primary electron beam on the sample surface gradually approaches 0 [eV] from the condition that has been controlled for the primary electron beam to reverse its direction before reaching the surface of the sample, and not reach the sample surface. This method is advantageous in that neutralizing can be achieved without a temporary progress in the storage of charge in the locally charged region due to the primary electron beam.

Figure 9:
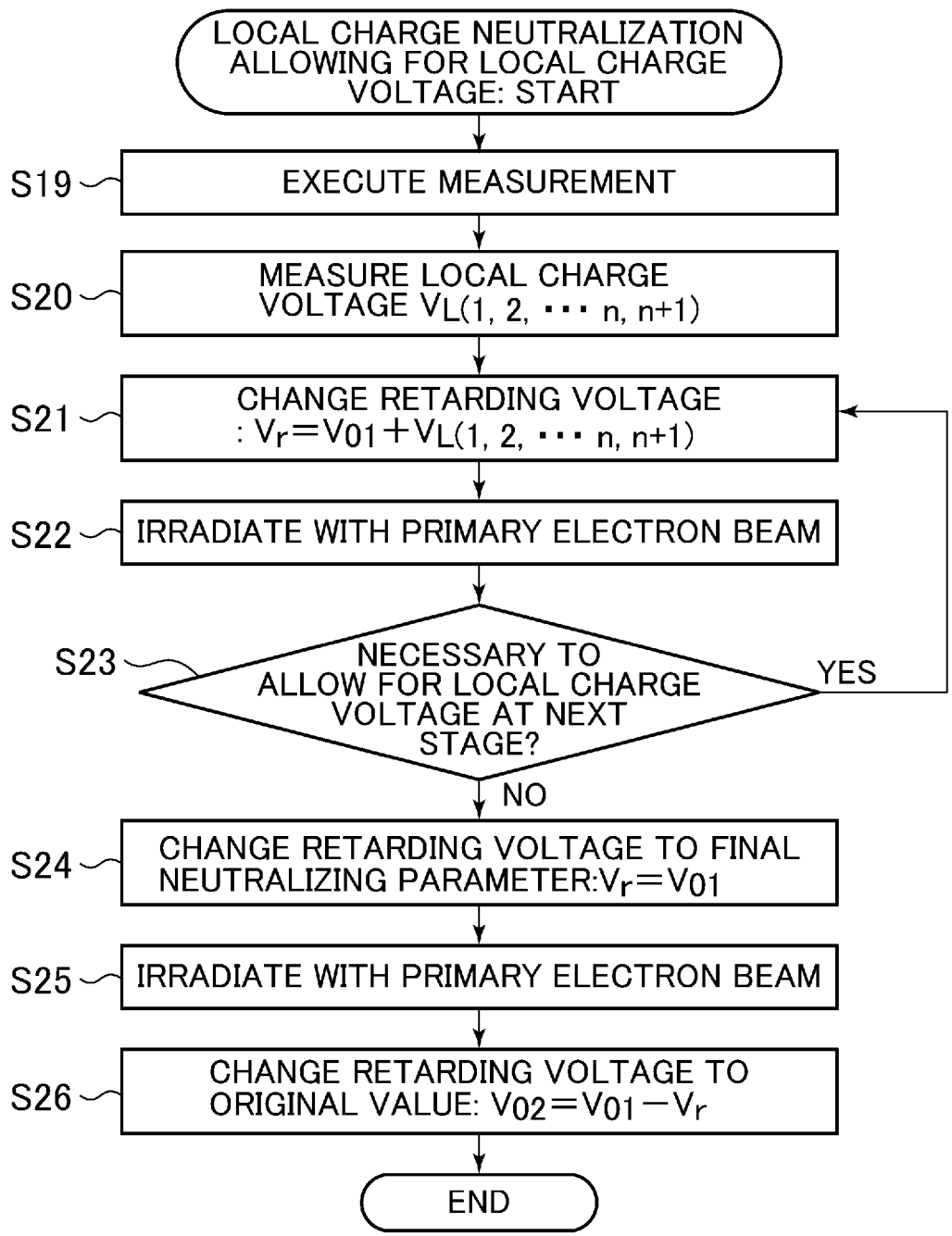
FIG. 9 is a flowchart of a charge-neutralizing step allowing for suppressed progress of a local charge in the absence of a global charge on the sample surface.

A further detailed description of the above is given below using FIGS. 7, 8, 9. FIG. 7 shows a case in which a global charge is absent on the sample and the local charge voltage $V_L$ neutralizes the sample under the condition of $V_r=V_0$. FIG. 8 shows a case in which neutralizing is conducted by controlling $V_r$ so that the energy of the primary electron beam on the sample surface gradually approaches 0 [eV] from the condition that prevents the primary electron beam from reaching the sample surface. FIG. 9 shows a flowchart of the neutralizing method shown in FIG. 8.

A description is given here of controlling the retarding voltage so that the energy of the primary electron beam on the sample surface gradually approaches 0 [eV] from the condition that has been controlled for the primary electron beam to reverse its direction before reaching the surface of the sample, and not reach the sample surface. Alternatively the retarding voltage may be controlled so that the energy of the primary electron beam on the sample surface gradually approaches 0 [eV] in the state that the primary electron beam reaches the sample under the condition of 1 or less in secondary electron emission efficiency δ, that is, in the primary electron energy range of 0-30 [eV].

In the case of $V_r=V_{01}$ as shown in FIG. 7, the energy of the primary electron beam 701 is usually in the vicinity of 0 [eV] and the beam does not reach the sample. In the region having a positive local charge, however, a primary electron beam 702 is delivered to the sample while being accelerated by a pre-neutralize local charge voltage $V_{L1}$, so the local charge may cause a progress in positive charging. The energy of the primary electron beam at this time will be expressed as $-V_{L1}$ [eV]. The retarding voltage $V_r$ during a start of neutralizing is therefore set to be $V_r=V_{01}+V_{L1}$. This allows neutralizing without a progress in the storage of charge. For example, if the local charge is a positive charge of 0.1 [kV] and the extracting/accelerating voltage is 3.0 [kV], the retarding voltage is set to be a negative voltage expressed as $V_r=3.0$ [kV]+0.1 [kV]=3.1 [kV]. Under this condition, in the locally charged region, acceleration energy of the primary electrons remains in the vicinity of 0 [eV], the charging of the sample does not progress, and only neutralizing occurs. In all other regions of the sample, acceleration energy of the primary electrons becomes −0.1 [eV], which prevents the primary electrons from reversing the direction and reaching the sample. Next as shown in (2) of FIG. 8, when neutralizing advances and the local charge voltage decreases from its pre-neutralize value to $V_{L2}$ ($V_{L2}<V_{L1}$), the primary electrons will be reversed immediately above the sample surface and neutralizing will be inexecutable. For this reason, the value of $V_r$ is gradually brought close to −3.0 [kV], as shown in (3) of FIG. 8. This creates substantially the same event as the neutralization described per (1), (2) of FIG. 8, and enables further neutralizing without impacting the sample. Finally, the local charge can be removed by neutralizing with $V_r=V_0$, as shown in (4) of FIG. 8.

The above neutralizing sequence is described in further detail below using FIG. 9. First after the measurement for image acquisition (step S19), the global charge voltage $V_{L1}$ is measured (step S20) and the retarding voltage is changed to satisfy $V_r=V_0+V_{L1}$ (step S21). Next in accordance with the condition that was set in step S21, a primary electron beam is emitted from the electron source towards the sample (step S22). When primary electron beam irradiation step S22 is executed and neutralizing under the condition set in step S21 is completed (step S23), steps S12 to S15 are repeated once again if it is necessary to change the retarding voltage allowing for local charge voltages at next stage (i.e., $V_{L2}$, $V_{L3}$, etc. up to $V_{Ln}$, where $V_{n+1}<V_n$). If the change is unnecessary, the retarding voltage $V_r$ is instead changed to satisfy $V_r=V_{01}$ that is a final neutralizing condition (step S24), and then a primary electron beam is emitted from the electron source towards the sample (step S25). After neutralizing with $V_r=V_0$, the retarding voltage $V_r$ is returned to its original value (step S26). Use of this sequence allows neutralizing without progressing further charging of the locally charged region.

Figure 10:
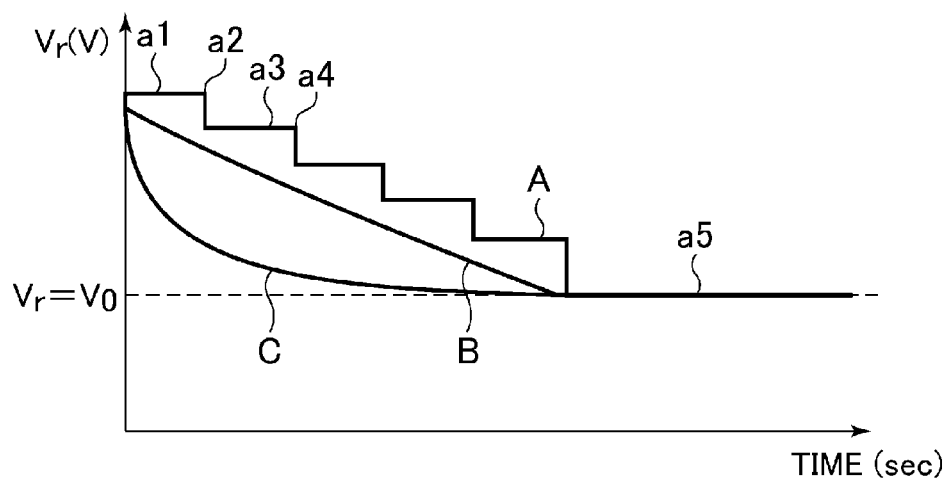
FIG. 10 is a diagram showing an example of conditions for changing a retarding voltage during neutralizing.

In the above neutralizing sequence, a change of the retarding voltage $V_r$ is repeated as in FIG. 10. Accordingly, after examining the state shown in (2) of FIG. 8, that is, the completed state of neutralizing, immediately changing the retarding voltage $V_r$ a necessary or desired number of times allows decreases in throughput to be suppressed without creating an unnecessary neutralizing time. The change of the retarding voltage $V_r$ may be conducted in steps as denoted by line A in FIG. 10, or may be done in a continuous sweep manner as denoted by lines B and C in FIG. 10. The steps denoted by line A in FIG. 10 indicate the following states. State 'a1', which corresponds to the state in (1) of FIG. 8, indicates that neutralizing is underway; state 'a2', which corresponds to the state in (2) of FIG. 8, indicates that neutralizing in a first step has just been completed; state 'a3', which corresponds to the state in (3) of FIG. 8, indicates that neutralizing in a second step has just been completed; and state 'a4', which corresponds to the state in (4) of FIG. 8, indicates that the neutralizing of the local charge has just been completed.

Figure 11:
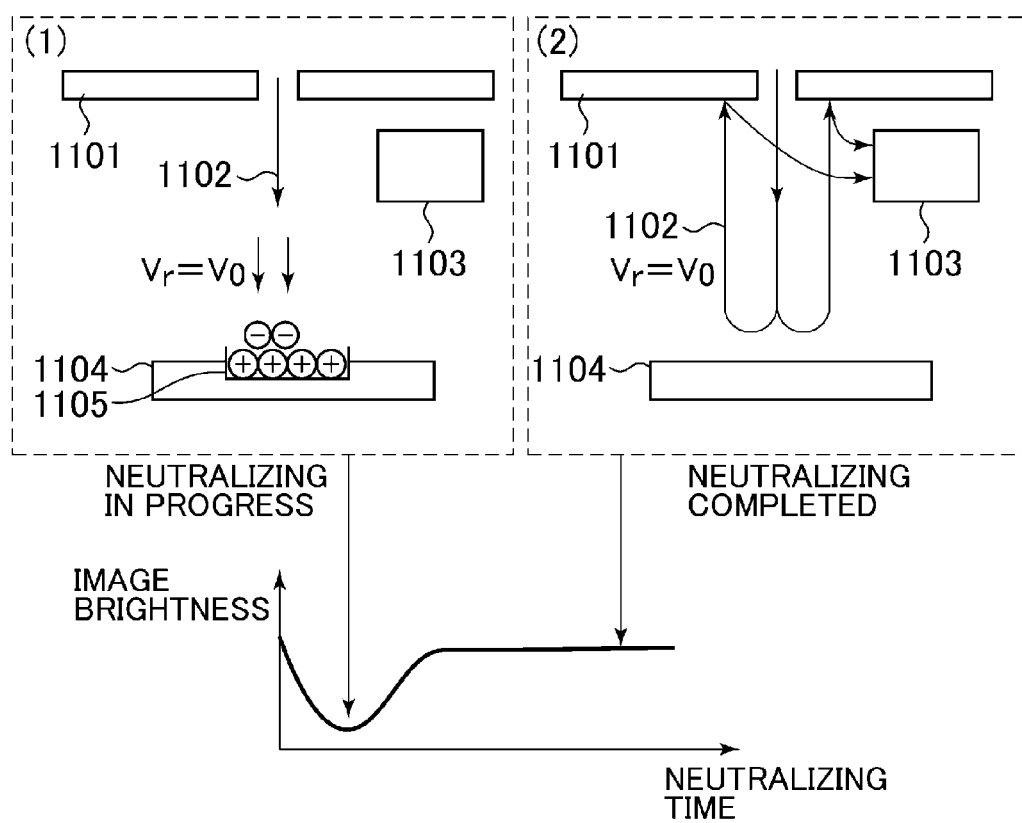
FIG. 11 is a diagram representing a relationship between image brightness and a progress of neutralizing.

Determination of whether neutralizing has been completed can use, for example, a method of measuring image brightness obtained during the neutralization. This method is described below using FIG. 11. In the state shown as (1) of FIG. 11, secondary electrons do not occur since the energy of the primary electron beam with respect to the sample is 0 [eV]. As a result, an output level of the secondary electron detector 9 decreases relative to a normal measurement level, and image brightness also decreases. As opposed to this, after neutralizing, as in (2) of FIG. 11, reverse traveling of the primary electron beam increases an output level of the secondary electron detector 9 relative to the above neutralizing level, and image brightness also increases. The end-of-neutralizing determination can therefore be based upon the change in the brightness of the image during neutralizing.

Figure 12:
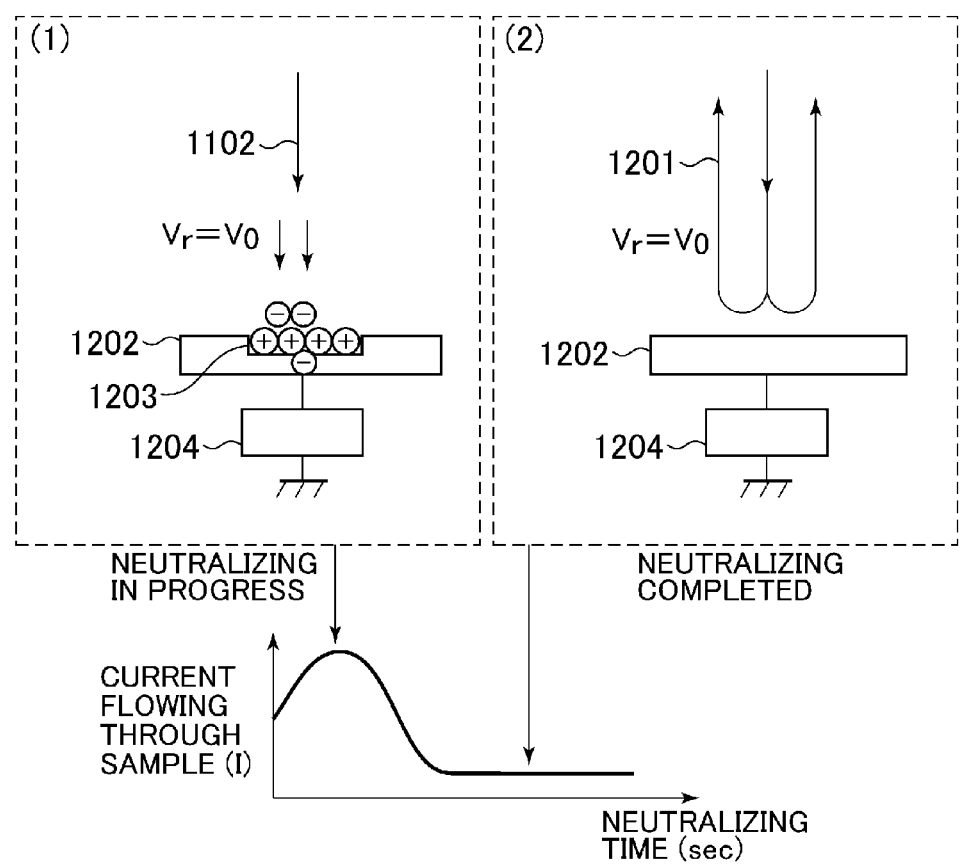
FIG. 12 is a diagram representing a relationship between a current flow through the sample and the progress of neutralizing.

Another method useable to determine whether neutralizing has been completed is by measuring a current that the sample has absorbed from the primary electron beam. This method is described below using FIG. 12. As shown in (1) of FIG. 12, during neutralizing, since the sample is irradiated with the primary electron beam, the primary electrons pass through the sample and the current flows out to around, so the current can be measured with an ammeter 1204. As shown in (2) of FIG. 12, however, once neutralizing has been completed, the primary electron beam is reversed and current does not flow through the sample. Examining the flow of current through the sample in this way allows the determination of the timing in which neutralizing is completed, and the timing in which the voltage is to be changed.

Other available methods include, for example, one in which to apply only a necessary neutralizing dose by calculating from the charge voltage the dose required for neutralizing, one in which to measure the local charge voltage developed during neutralizing. The dose required for neutralizing can be calculated by measuring a correlation between the charge voltage and the neutralizing dose beforehand. The local charge voltage can be calculated by executing the steps of disposing a detector in the lens system of the charged particle beam apparatus, detecting a position that mirrored electrons reach, and utilizing a relationship between the retarding voltage $V_r$ and a "shift", a difference between a passing position of incident electrons and the position that mirrored electrons reach. The local charge voltage can likewise be calculated by measuring primary electron beam irradiation areas on samples of different materials, and the correlation between the dose and the charge voltage.

Although the retarding voltage $V_r$ is changed in the flowchart of FIG. 9, only the extracting/accelerating voltage $V_{01}$ or both the retarding voltage $V_r$ and the extracting/accelerating voltage $V_{01}$ may be changed instead.

Sixth Embodiment

While in the first to fifth embodiments each measurement of the sample has been followed by neutralizing, all necessary neutralizing may instead be executed at one time after a plurality of measurements in a neutralize executable area. This method reduces neutralizing time and suppresses a decrease in throughput. In the case of the critical-dimension SEM, the sample is irradiated with a primary electron beam to place focus on a position anterior to the measuring point, or to determine the position. The plurality of measurements in this DESCRIPTION refer to the point at which the sample is irradiated with the primary electron beam as a preparatory measuring step, and an actual measuring point, or refer to the plurality of measurements actually conducted.

Figure 13:
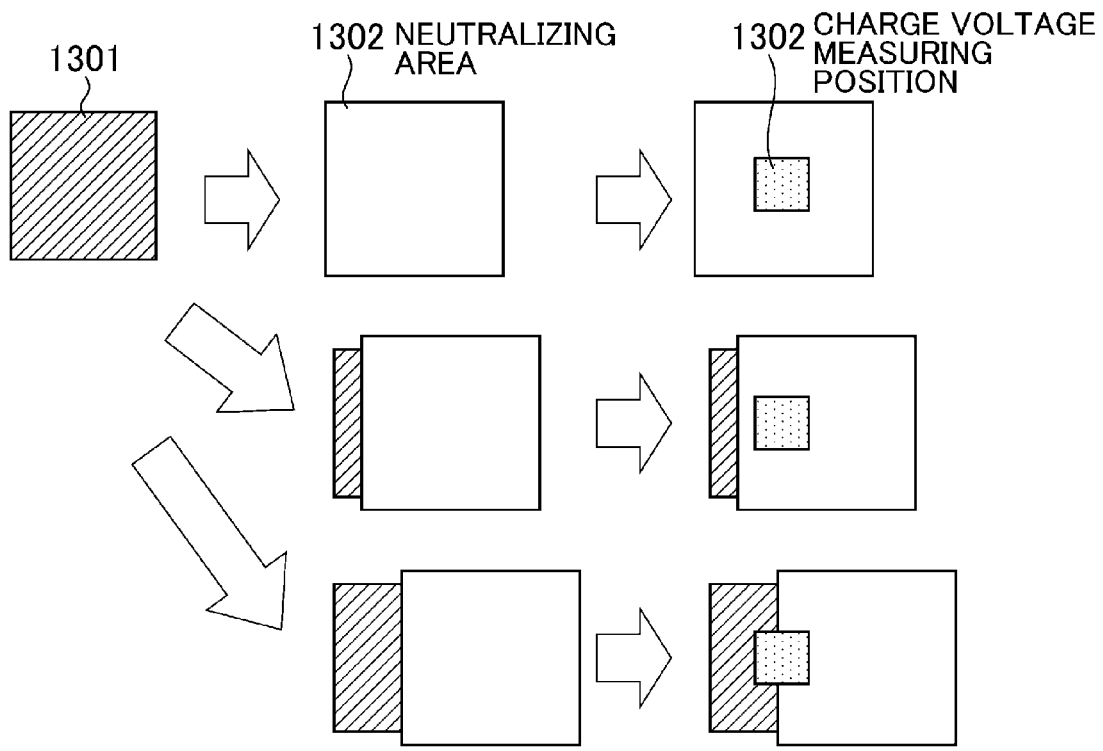
FIG. 13 is a diagram showing an example of a method for checking a neutralize executable area.

To neutralize the plurality of points collectively, there is a need to calculate the neutralize executable area beforehand. The neutralize executable area is an area in which the primary electron beam can be raster-scanned. One way useable to conduct the calculation is therefore by, for example, conducting the raster scan, then checking a primary-electron beam irradiation executable area from a size of the obtained scan image, and adopting this area as the neutralize executable area. Another useable way is by, as shown in FIG. 13, creating a local charge region, next moving the sample stage and changing the neutralizing position, and repeating this procedure. After neutralizing, the charge voltage is measured centrally in the local charge region and the region having a charge voltage of 0 [V] is adopted as the neutralize executable area.

Figure 14:
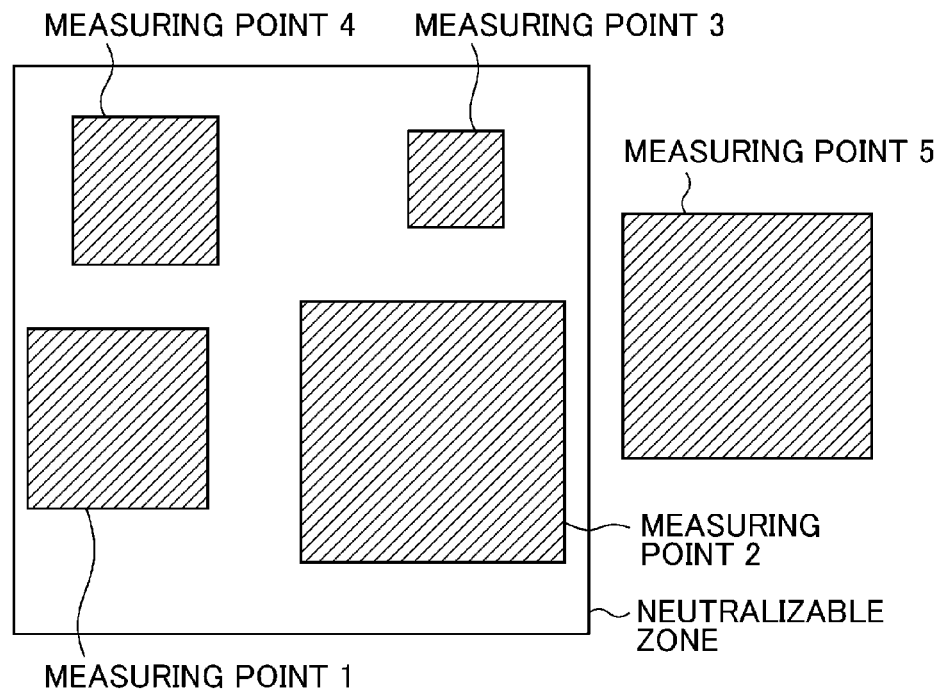
FIG. 14 is a schematic diagram showing a method of neutralizing a plurality of local charges at one time.

Next, a method of neutralizing a plurality of local charges is described below using FIG. 14. This figure assumes that measurements are conducted at measuring points 1, 2, etc. up to a final measuring point, in that order. Since the neutralize executable area is known, if the positions of the measuring points and the primary-electron beam irradiation area are also known, the measuring points 1 to 4 in the neutralize executable area can all be subjected to collective neutralizing.

When the plurality of local charges are neutralized collectively in this way, since the neutralizing area will be large, the number of primary electrons delivered to a unit area will decrease and neutralizing efficiency will also decrease. The neutralizing dose may therefore need to be increased for a shorter neutralizing time. Several methods are available to increase the neutralizing dose. For example, these methods are by: (1) increasing a probe current of the primary electron beam; (2) setting the neutralizing region to be dimensionally equal to the local charge region; (3) providing a diaphragm or stop that allows the primary electron beam to pass through more readily than under normal conditions, changing the diaphragm or stop during neutralizing, and increasing the probe current, or removing the diaphragm or stop during neutralizing and increasing the probe current, or mounting a larger-dose electron gun.

Figure 15:
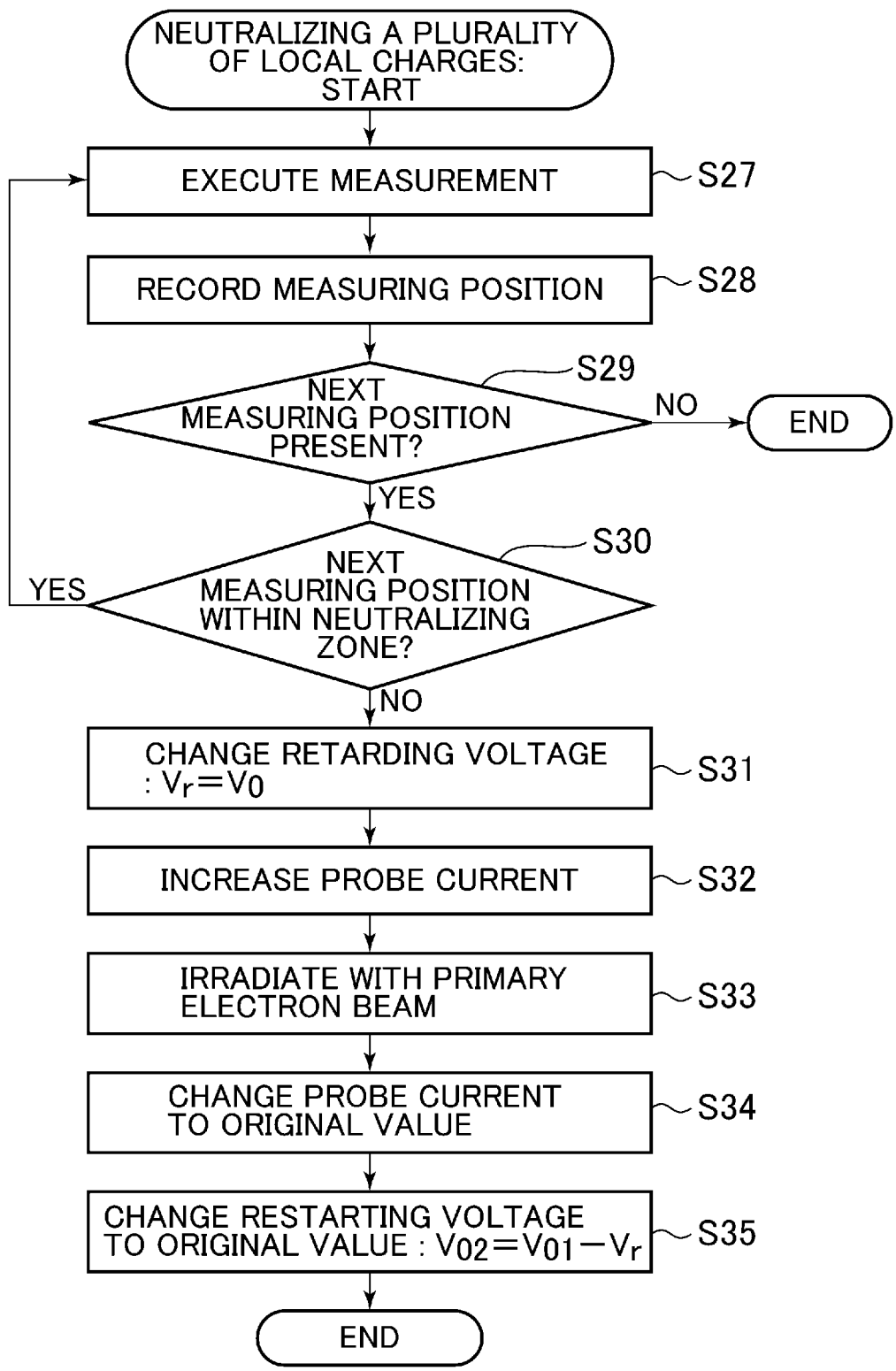
FIG. 15 is a flowchart showing the step of neutralizing a plurality of local charges.

It follows from the above that the neutralization uses the following sequence. As shown in FIG. 15, after the measurement for image acquisition (step S27), the measuring position and region are recorded (step S28), if a next measuring position is present (step S29) and the next measuring position is outside the measuring range (step S30), the retarding voltage $V_r$ is changed (step S31), and the probe current is increased (step S32). Next in accordance with the conditions that were set in step S31, S32, a primary electron beam is emitted from the electron source towards the sample (step S33). After neutralizing, the probe current that was set in step S32 is returned to an original value (step S34) and the retarding voltage $V_r$ that was set in step S31 is also changed to an original value (step S35). Use of this sequence allows neutralizing with a suppressed decrease in throughput.

To suppress decreases in throughput, it is effective to conduct neutralizing only at the position where the local charge is likely to impact the next and subsequent measurements. If the local charge is regarded as influential upon the next measurement, this refers to a case in which the amount of astigmatism, a magnification error, and/or the field-of-view deviation oversteps a threshold value. A zone in which the local charge is likely to impact the measurement can be determined by examining beforehand a correlation between, for example, the charge voltage, a distance from the local charge, and the amount of astigmatism, magnification error, and field-of-view deviation during the measurement. For example, a charge region is created at a fixed charge voltage, the distance from the charge is varied, and a sample of a known size is measured. The amount of astigmatism, magnification error, and field-of-view deviation at that time are checked and the zone where the local charge is likely to impact the measurement is determined. If the same as these operations is executed following completion of a change of the charge voltage, it can be derived how the zone in which the local charge is estimated to impact the measurement will depend upon the charge voltage and upon the distance. In addition, the charge voltage is determined from the measuring or primary electron beam irradiation area, the dose, and the material of the sample.

Furthermore, when this method is used, the neutralizing time can be reduced by increasing the neutralizing dose.

Figure 16:
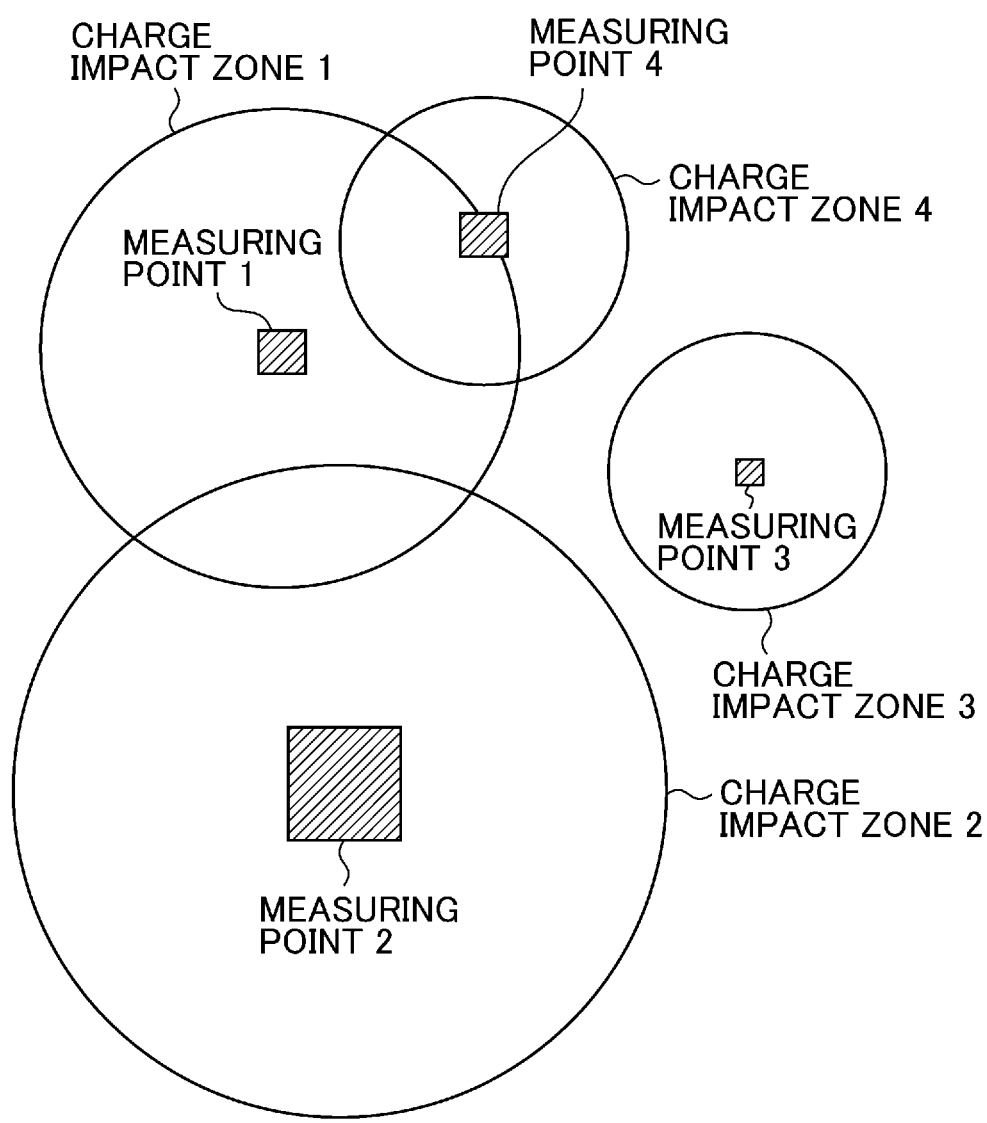
FIG. 16 is a diagram that shows local charge positions and charge impact zones likely to impact a next measurement.

The neutralizing method in this case is described below using FIG. 16. FIG. 16 shows the measurement areas and charge impact zones relating to four-point measurements. If the charge voltage and the measuring position are known beforehand, one can know the impact zone of the charge upon the measurement. Referring to FIG. 16, the local charges at measuring points 2, 3 do not need to be neutralized, since these charges have no impact upon other measuring points. The local charge at measuring point 1, however, needs to be neutralized, since this charge has an impact upon measuring point 4. In this way, neutralizing is done only upon the local charges estimated to impact the next and subsequent measurements.

Figure 17:
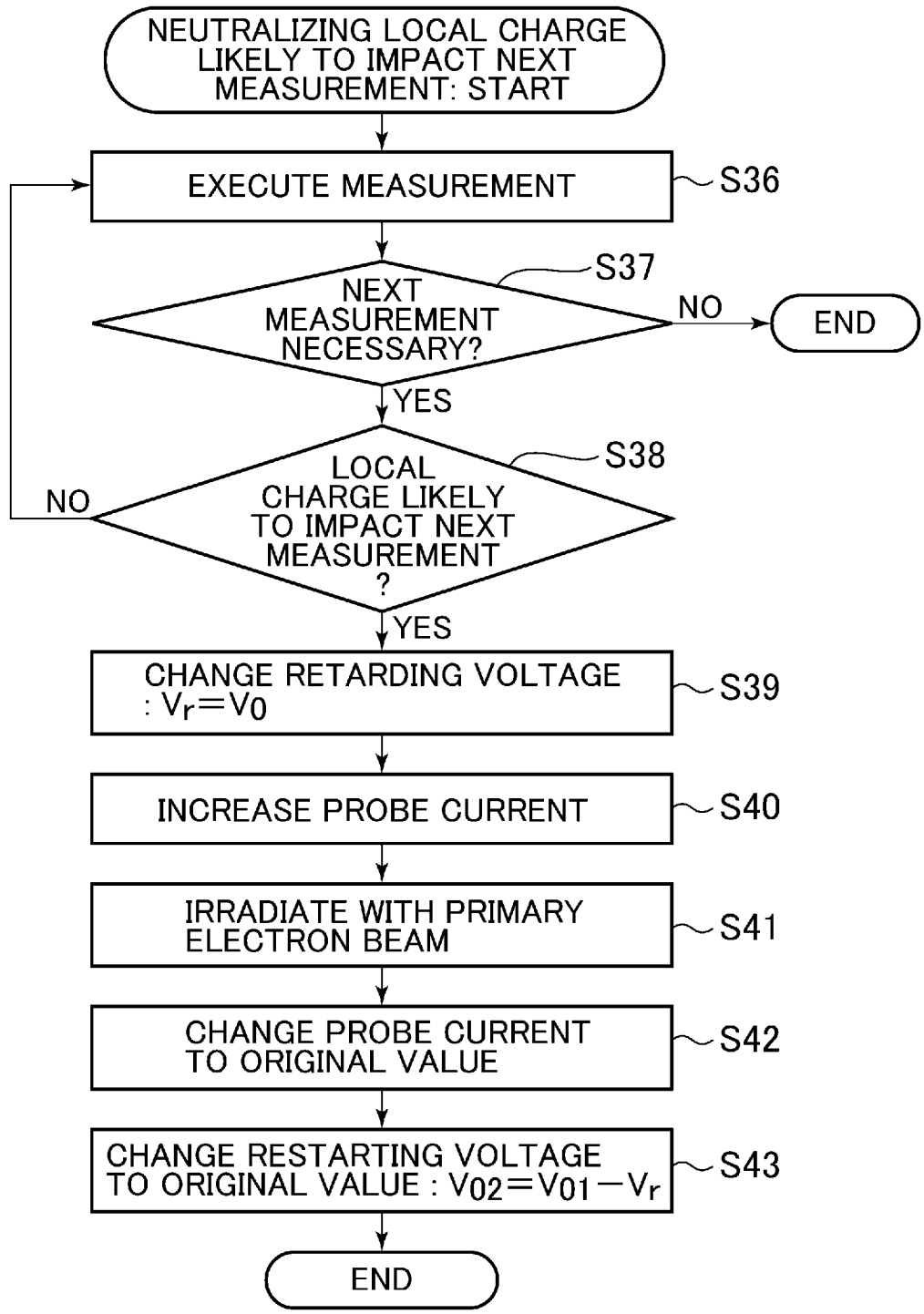
FIG. 17 is a flowchart showing the step of neutralizing a local charge likely to impact the next measurement.

The neutralizing sequence is shown in FIG. 17. After the measurement (step S36) for image acquisition, if the next measuring position is present (step S37), the impact that the local charge is estimated to cause to the next measurement is assessed (step S38). If the local charge is determined to impact the next measurement, the retarding voltage $V_r$ is changed (step S39) and the probe current is increased (step S40). Next in accordance with the conditions that were set in step S39, S40, a primary electron beam is emitted from the electron source towards the sample (step S41). After neutralizing, the probe current that was set in step S40 is changed to an original value (step S42) and the retarding voltage $V_r$ that was set in step S41 is also changed to an original value (step S43).

Seventh Embodiment

In a further way to suppress decreases in throughput, an impact of the local charge upon the primary electron beam is monitored in terms of a field-of-view deviation, astigmatism, changes in measured data, and the like, and if these values overstep predetermined threshold values, neutralizing is executed for all measuring points that have existed by that time, or for any several previous ones of these measuring points. Neutralizing at the several previous measuring points is preferably continued until the impact of the local charge has disappeared. How many measuring points are to be traced back to remove the impact of the local charge by neutralizing can be determined by examining the correlation between the charge voltage, the distance from the local charge, and the amount of astigmatism, magnification error, and field-of-view deviation developed during the measurement.

In addition, if as with the above conditions, the current primary-electron beam irradiating position and local charge position are different, the primary electron beam is not likely to be capable of being delivered to the local charge region and is thus likely to be delivered to a region unable to be neutralized. In this case, it is necessary to bend the primary electron beam path or move the stage or execute both, and then irradiate the local charge region with a primary electron beam to conduct neutralizing. The deflecting coils, focusing lens, a diaphragm or stop, or the like is used to move the primary electron beam, and measuring positions are recorded prior to moving the stage. These methods enable the irradiation of the local charge region with a primary electron beam, and hence, neutralizing.

If, as in precharging, the sample is irradiated with primary electron beams more extensively than for normal measurement, this may cause a more extensive local charge region than the neutralize executable region. If this actually occurs, the above method allows more extensive neutralizing of local charges by irradiating the local charge region with the primary electron beams.

Figure 18:
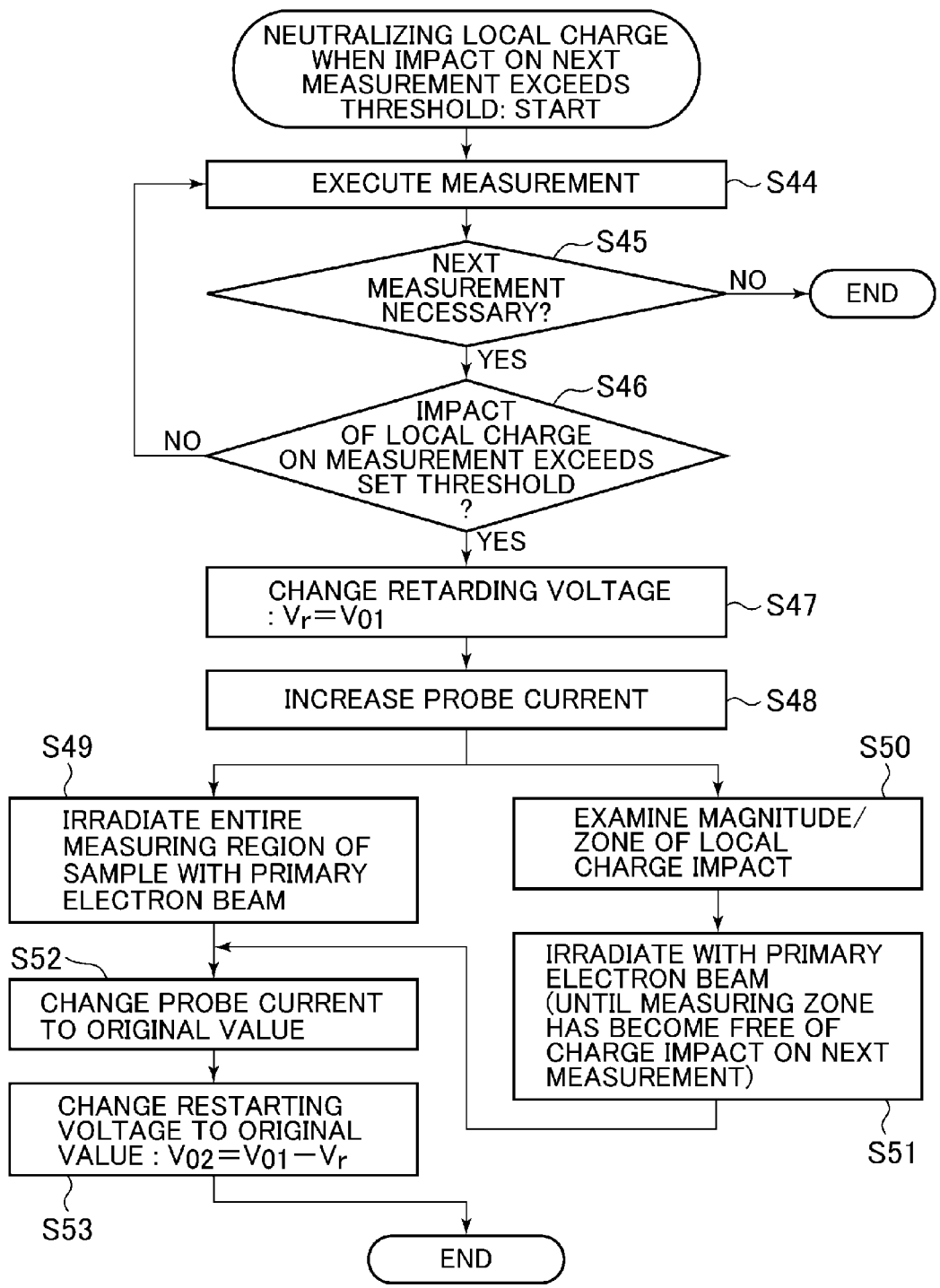
FIG. 18 is a flowchart showing the step of neutralizing a local charge whose impact on the next measurement exceeds a threshold level.

FIG. 18 shows a neutralizing sequence applied in the case that the impact of the local charge upon the primary electron beam is to be monitored and if predetermined threshold values are overstepped, neutralizing is to be executed. After the measurement for image acquisition has been repeated several times (step S44), if a next measuring position is present (step S45), the impact that the local charge is estimated to cause to the next measurement is assessed (step S46). If the local charge is determined to impact the next measurement, the retarding voltage $V_r$ is changed (step S47) and the probe current is increased (step S48). Next if all existing measuring positions are to be subjected to neutralizing, the region containing all the existing measuring positions is irradiated with primary electron beams to neutralize the local charge (step S49). When neutralizing is to be repeated to an extent that the impact of the local charge upon the measurement disappears, the impact zone of the local charge upon the measurement is examined using the above method or equivalent (step S50) and then the neutralization is conducted by continuing primary electron beam irradiation until the impact upon the next measuring point (x) has disappeared (step S51). After neutralizing, the probe current that was set in step S48 is changed to an original value (step S52) and the retarding voltage $V_r$ that was set in step S47 is also changed to an original value (step S53)

Eighth Embodiment

Figure 19:
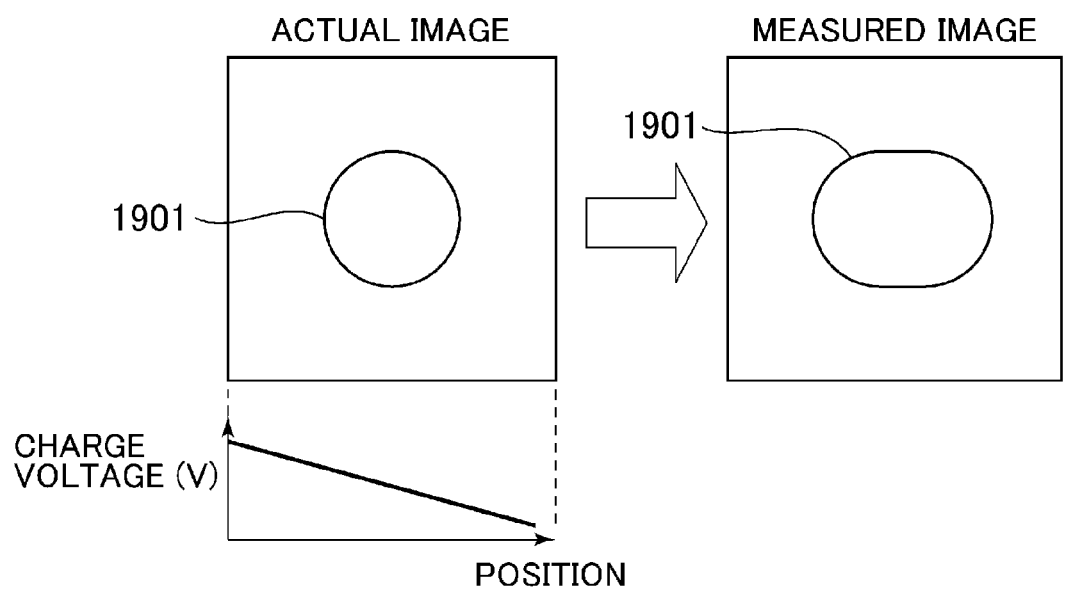
FIG. 19 is a diagram showing a change in image due to a differential potential within FOV.

The above embodiments have been intended to remove the local charge caused by primary-electron beam irradiation. Even if the local charge is not caused, however, the neutralization itself is advantageous in the following cases. If the sample has a global charge, not all of the charge is necessarily uniform in the wafer plane. For this reason, a normal image may not be acquirable since, for example, a magnification error is likely to occur and thus, as shown in FIG. 19, a hole pattern in the sample is likely to be imaged in distorted form. Accordingly if the sample originally holds a global charge and this charge is nonuniform, or if a charge is already present in a local region of the sample before a start of measurement, executing neutralization unifies the electric potential within the sample, thus enabling normal image acquisition and measurement.

DESCRIPTION OF REFERENCE NUMBERS

101, 201, 501 Electron sources
102, 202, 502, 701, 702, 801, 802, 1102, 1201 Primary electron beams
103 Condenser lens
104 Reflective plate
105 Deflecting (scanning) coil
106 Objective lens
107, 204, 504, 703, 803, 1104, 1202 Samples
108, 205, 505 Secondary electrons
109, 1103 Secondary electron detectors
110, 207, 507 Retarding power supplies
111 Sample stage
112, 206, 506 Accelerating power supplies
113, 203, 503, 1101 Primary electron accelerating electrodes
114 High-voltage controller
115 Power supply
116 Image shift controller
117 Scan controller
118 Stage controller
119 Position controller
120 Retarding voltage controller
121 Amplifier
122 Arithmetic unit
123 Image memory
124 Arithmetic device
125 Display device
126, 1204 Ammeters
127 Ammeter controller
128 Control device
208, 509 Primary electron irradiation ranges
209, 510, 704, 804, 805, 1105, 1203, 1301 Local charges
210, 512 Neutralizing the positive charge and primary electrons in charged region
211, 511 Electrons without landing energy
401 In sample (wafer) plane
508 Global charge
1302 Neutralizing area
1303 Charge voltage measuring position (Local charge center)
1901 Hole pattern in sample

The invention claimed is:

1. A charged particle beam apparatus, comprising:
a charged particle source;
a charged particle detector that detects charged particles;
a power supply that applies an accelerating voltage between an accelerating electrode and the charged particle source for accelerating a charged particle beam;
a sample stage on which to mount a sample;
a power supply that applies a retarding voltage to the sample storage for decelerating the charged particle beam; and
a control computer that controls the accelerating voltage or/and the retarding voltage;
wherein the control computer is configured to:
execute a first charged particle beam irradiation to a first area of the sample for measuring a pattern formed on the sample under a condition that the retarding voltage has a value smaller than that of the accelerating voltage; and
after the execution of the first charged particle beam irradiation, control at least one of the power supply that applies an accelerating voltage and the power supply that applies a retarding voltage to execute a second charged particle beam irradiation to a second area of the sample that is larger than the first area, the second charged particle beam having a smaller landing energy than the first charged particle beam,
wherein the landing energy of the second charged particle beam is in the −20 to 30 [V] range.

2. The charged particle beam apparatus according to claim 1, wherein:
the control computer controls the value of the retarding voltage to increase in a negative direction, and thus undertakes control to neutralize an electric charge by reducing a difference between the value of the retarding voltage and that of the accelerating voltage to a value smaller than that obtained during the measurement.

3. The charged particle beam apparatus according to claim 1, wherein:
the control computer controls a difference between the value of the retarding voltage and that of the accelerating voltage to a −20 to 0 [V] range, thereby neutralizing an electric charge.

4. The charged particle beam apparatus according to claim 1, wherein:
the control computer controls a difference between the value of the retarding voltage and that of the accelerating voltage to a 0 to 30 [V] range, thereby neutralizing an electric charge.

5. The charged particle beam apparatus according to claim 1, wherein:
the control computer neutralizes an electric charge by controlling a difference between the value of the retarding voltage and that of the accelerating voltage so that the difference heads for 0 [V].

6. The charged particle beam apparatus according to claim 1, wherein:
the control computer controls operation to neutralize an electric charge by converging a difference between the value of the retarding voltage and that of the accelerating voltage so that the difference becomes 0 [V].

7. The charged particle beam apparatus according to claim 1, wherein the control computer is configured to:
after the measurement of the sample, measure a global charge voltage of the sample; and
execute control to neutralize an electric charge by reducing a difference between the value of the retarding voltage and a value obtained by subtracting a value of the global charge voltage from that of the accelerating voltage.

8. The charged particle beam apparatus according to claim 1, wherein:
the control computer controls the value of the retarding voltage to increase in a negative direction, and thus undertakes control to neutralize an electric charge by reducing a difference between the value of the retarding voltage and a value obtained by subtracting a value of the global charge voltage from that of the accelerating voltage.

9. The charged particle beam apparatus according to claim 1, wherein:
the control computer undertakes control to neutralize an electric charge by regulating to a −20 to 0 [V] range a difference between the value of the retarding voltage and a value obtained by subtracting a value of the global charge voltage from that of the accelerating voltage.

10. The charged particle beam apparatus according to claim 1, wherein:
the control computer undertakes control to neutralize an electric charge by regulating to a 0 to 30 [V] range a difference between the value of the retarding voltage and a value obtained by subtracting a value of the global charge voltage from that of the accelerating voltage.

11. The charged particle beam apparatus according to claim 1, wherein:
the control computer neutralizes an electric charge by conducting control so that a difference between the value of the retarding voltage and a value obtained by subtracting a value of the global charge voltage from that of the accelerating voltage will head for 0 [V].

12. The charged particle beam apparatus according to claim 1, wherein the control computer is configured to:
after the measurement of the sample, measure a charge voltage of the sample;
acquire a correlation between the charge voltage and a release quantity of the charged particle beam; and
execute control to implement the neutralization based upon a calculation result of the release quantity.

13. The charged particle beam apparatus according to claim 1, wherein the control computer is configured to:
repeat the measurement of the sample a plurality of times under a condition that the retarding voltage has a value smaller than that of the accelerating voltage;
after the plurality of repeated measurements, determine whether at least two of all regions on the sample which has been repeatedly measured the plurality of times are included in regions subjected to simultaneous neutralizing of electric charges; and
if at least the two regions on the sample are determined to be included in the regions subjected to simultaneous charge neutralizing, conduct control upon the measured sample regions including at least the two regions, and thus execute simultaneous neutralizing by reducing a difference between the value of the retarding voltage and that of the accelerating voltage to a value smaller than that obtained during the measurements.

14. The charged particle beam apparatus according to claim 1, wherein the control computer is configured to:
repeat the measurement of the sample a plurality of times under a condition that the retarding voltage has a value smaller than that of the accelerating voltage;
after any one of the plurality of repeated measurements, determine whether at least two regions of all those of the sample under the measurement of interest are included in regions subjected to simultaneous neutralizing of electric charges; and
if at least the two regions on the sample are determined to be included in the regions subjected to simultaneous charge neutralizing, conduct neutralizing control upon the measured sample regions including at least the two regions, and thus execute simultaneous neutralizing by reducing a difference between the value of the retarding voltage and that of the accelerating voltage to a value smaller than that obtained during the measurement of interest.

15. The charged particle beam apparatus according to claim 13, wherein:
the determination of whether at least the two regions of all those of the measured sample are included in the regions subjected to simultaneous charge neutralizing is based upon an area of irradiation with the charged particle beam emitted from the charged particle source.

16. The charged particle beam apparatus according to claim 1, wherein the control computer is configured to:
repeat the measurement of the sample a plurality of times under a condition that the retarding voltage has a value smaller than that of the accelerating voltage;
after any one of the plurality of repeated measurements, determine whether at least two regions of all those of the sample under the measurement of interest include a measurement region estimated to impact a next measurement region of the sample; and
if the measurement region estimated to impact the next measurement region of the sample is determined to be included, conduct neutralizing control upon the measured sample regions and execute simultaneous neutralizing by reducing a difference between the value of the retarding voltage and that of the accelerating voltage to a value smaller than that obtained during the measurement of interest.

17. The charged particle beam apparatus according to claim 14, wherein:

the determination of whether at least the two regions of all those of the measured sample are included in the regions subjected to simultaneous charge neutralizing is based upon an area of irradiation with the charged particle beam emitted from the charged particle source.

* * * * *